United States Patent
Takahashi

(10) Patent No.: US 9,707,757 B2
(45) Date of Patent: Jul. 18, 2017

(54) PHOTOSENSITIVE NEGATIVE RESIN COMPOSITION

(71) Applicant: CANON KABUSHIKI KAISHA, Tokyo (JP)

(72) Inventor: Hyou Takahashi, Kunitachi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 526 days.

(21) Appl. No.: 14/225,662

(22) Filed: Mar. 26, 2014

(65) Prior Publication Data

US 2014/0307022 A1 Oct. 16, 2014

(30) Foreign Application Priority Data

Apr. 10, 2013 (JP) ................. 2013-081950

(51) Int. Cl.
| | |
|---|---|
| G03F 7/004 | (2006.01) |
| G03F 7/20 | (2006.01) |
| G03F 7/038 | (2006.01) |
| B41J 2/14 | (2006.01) |
| B41J 2/16 | (2006.01) |

(52) U.S. Cl.
CPC ........... *B41J 2/1433* (2013.01); *B41J 2/1603* (2013.01); *B41J 2/1631* (2013.01); *B41J 2/1639* (2013.01); *G03F 7/0045* (2013.01); *G03F 7/0046* (2013.01); *G03F 7/038* (2013.01); *G03F 7/0385* (2013.01)

(58) Field of Classification Search
CPC ...... G03F 7/0042; G03F 7/0046; G03F 7/038; G03F 7/0385
See application file for complete search history.

(56) References Cited

U.S. PATENT DOCUMENTS

| | | | |
|---|---|---|---|
| 5,478,606 A | 12/1995 | Ohkuma et al. | |
| 8,278,030 B2 | 10/2012 | Suzuki et al. | |
| 8,394,575 B2 | 3/2013 | Wu et al. | |
| 8,980,968 B2 | 3/2015 | Takahashi et al. | |
| 9,268,222 B2 * | 2/2016 | Takahashi | G03F 7/0045 |
| 2008/0292986 A1 | 11/2008 | Park et al. | |
| 2008/0292993 A1 | 11/2008 | Ishikura et al. | |
| 2011/0244393 A1 | 10/2011 | Ikeda | |
| 2012/0040288 A1 | 2/2012 | Adams et al. | |
| 2012/0229556 A1 | 9/2012 | Ikegame et al. | |
| 2013/0235119 A1 | 9/2013 | Takahashi et al. | |
| 2014/0329175 A1 | 11/2014 | Takahashi et al. | |

FOREIGN PATENT DOCUMENTS

| | | |
|---|---|---|
| JP | 4-10940 A | 1/1992 |
| JP | 3143307 B2 | 3/2001 |
| JP | 2005-75885 A | 3/2005 |
| JP | 2008-256980 A | 10/2008 |
| JP | 2011-164216 A | 8/2011 |
| WO | 2009/136482 A1 | 11/2009 |
| WO | 2010/001919 A1 | 1/2010 |
| WO | 2011/096195 A1 | 8/2011 |
| WO | 2013/115393 A1 | 8/2013 |

OTHER PUBLICATIONS

Light Measurment Glossary| ILT, International light Technologies, Copyright © 2002-2016 International Light Technologies, 10 Technology Drive, Peabody, Massachusetts 01960, 12 pages obtained from https://www.intl-lighttech.com/support/light-measurement-glossary obtained from internet Mar. 2017 copyright 2016, 12 pages.*
U.S. Appl. No. 14/360,401, filed May 23, 2014, Takahashi et al.

* cited by examiner

*Primary Examiner* — Cynthia Hamilton
(74) *Attorney, Agent, or Firm* — Fitzpatrick, Cella, Harper & Scinto

(57) ABSTRACT

A photosensitive negative resin composition including (a) an epoxy-group-containing compound, (b) a first onium salt including a cation moiety structure represented by formula (b1) and an anion moiety structure represented by formula (b2), and (c) a second onium salt including a cation moiety structure represented by formula (c1) and an anion moiety structure represented by formula (c2).

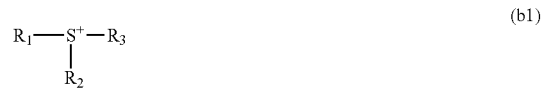

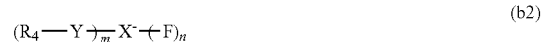

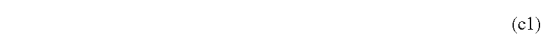

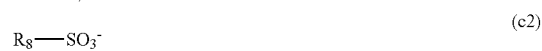

6 Claims, 3 Drawing Sheets

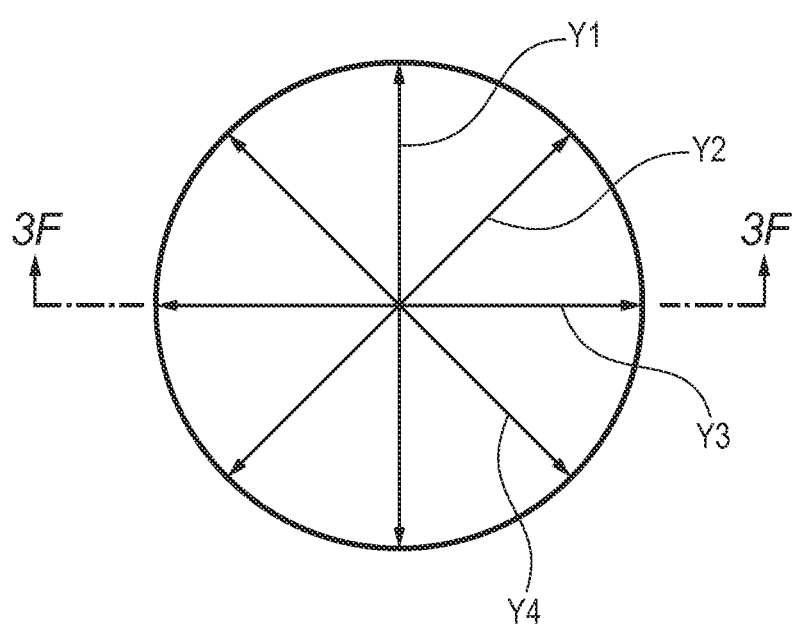

PHOTOSENSITIVE NEGATIVE RESIN COMPOSITION

BACKGROUND OF THE INVENTION

Field of the Invention

The present invention relates to a photosensitive negative resin composition, in particular a photosensitive negative resin composition suitable for forming a fine structure by a photolithography process.

Description of the Related Art

As a fine processing technique, a photolithography technique is known in which a negative photosensitive resin is exposed and developed to form a structure (fine structure) having a fine pattern. This technique is widely used for, for example, applications of production of semiconductor integrated circuits, applications of production of masks for use in semiconductor exposure, applications of production of various MEMS (Micro Electro Mechanical Systems). As examples of the applications of production of MEMS, practical applications of this technique are being advanced in various compact sensors, microprobes, thin film magnetic heads, and ink jet recording heads.

As an apparatus for performing exposure, a stepper using the i-line as a light source has been widely used. In this technical field, it has recently been demanded to produce structures having more complicated and high-definition structures, and accordingly negative photosensitive resins have been desired which are capable of forming fine structures exhibiting high precision, under the action of light from a light source through a photomask. Examples of the high-definition structure include a nozzle ejection orifice of an ink jet recording head, wherein it is important to form the shape of the ejection orifice with good mask reproducibility.

As an example of the negative photosensitive resin, Japanese Patent Application Laid-Open No. 2008-256980 discloses a photosensitive resin composition including a polyfunctional epoxy resin and a cationic polymerization initiator.

Japanese Patent No. 3143307 discloses an ink jet head for production of MEMS including a nozzle ejecting an ink droplet by allowing bubbles generated by heating the heating resistor to communicate with the air outside. As the coating resin to be used for forming the ink flow-path wall of the ink jet head, there is disclosed a resin composition mainly composed of an epoxy resin solid at normal temperature.

SUMMARY OF THE INVENTION

An aspect of the present invention is a photosensitive negative resin composition including:
(a) an epoxy-group-containing compound,
(b) a first onium salt including a cation moiety structure represented by formula (b1) and an anion moiety structure represented by formula (b2), and
(c) a second onium salt including a cation moiety structure represented by formula (c1) and an anion moiety structure represented by formula (c2).

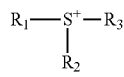

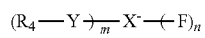

($R_1$ to $R_3$ each independently represent an organic group having 1 to 30 carbon atoms which may have a substituent. In the whole constituent atoms of $R_1$ to $R_3$, at least two or more oxygen atoms are included. X is selected from the group consisting of a carbon atom, a nitrogen atom, a phosphorus atom, a boron atom and an antimony atom. Y is selected from the group consisting of —S($=$O)$_2$—, an alkylene fluoride group, —O—CF$_2$—, —C($=$O)—CF$_2$—, —O—C($=$O)—CF$_2$—, —C($=$O)—O—CF$_2$—, and a single bond. $R_4$ represents a hydrocarbon group having 1 to 30 carbon atoms which may be substituted with a fluorine atom. In the case where X represents a carbon atom, m and n represent integers that satisfy m+n=3 and n=0, 1, 2; in the case where X represents a nitrogen atom, m and n represent integers that satisfy m+n=2 and n=0, 1; in the case where X represents a phosphorus atom or an antimony atom, m and n represent integers that satisfy m+n=6 and n=0 to 6; in the case where X represents a boron atom, m and n represent integers that satisfy m+n=4 and n=0 to 3.)

(A represents a nitrogen atom or a phosphorus atom. $R_4$ to $R_7$ each independently represent an organic group having 1 to 15 carbon atoms which may have a substituent. $R_8$ represents an organic group having 1 to 20 carbon atoms which may have a substituent.)

Another aspect of the present invention is a photosensitive negative resin composition including:
(a) an epoxy-group-containing compound,
(b) a first onium salt including a cation moiety structure represented by formula (b1) and an anion moiety structure represented by formula (b2), and
(d) a third onium salt including a cation moiety structure represented by formula (d1) and an anion moiety structure represented by formula (d2).

($R_1$ to $R_3$ each independently represent an organic group having 1 to 30 carbon atoms which may have a substituent. In the whole constituent atoms of $R_1$ to $R_3$, at least two or more oxygen atoms are included. X is selected from the group consisting of a carbon atom, a nitrogen atom, a phosphorus atom, a boron atom and an antimony atom. Y is selected from the group consisting of —S($=$O)$_2$—, an alkylene fluoride group, —O—CF$_2$—, —C($=$O)—CF$_2$—, —O—C($=$O)—CF$_2$—, —C($=$O)—O—CF$_2$—, and a single bond. $R_4$ represents a hydrocarbon group having 1 to 30 carbon atoms which may be substituted with a fluorine atom. In the case where X represents a carbon atom, m and n represent integers that satisfy m+n=3 and n=0, 1, 2; in the case where X represents a nitrogen atom, m and n represent integers that satisfy m+n=2 and n=0, 1; in the case where X represents a phosphorus atom or an antimony atom, m and n represent integers that satisfy m+n=6 and n=0 to 6; in the case where X represents a boron atom, m and n represent integers that satisfy m+n=4 and n=0 to 3.)

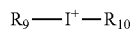 (d1)

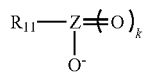 (d2)

($R_9$ and $R_{10}$ each independently represent an aryl group having 6 to 15 carbon atoms which may have a substituent. Z is selected from the group consisting of a carbon atom and a sulfur atom. In the case where Z is a carbon atom, k=1; in the case where Z is a sulfur atom, k=2. $R_{11}$ represents an organic group having 1 to 20 carbon atoms which may have a substituent.)

Further features of the present invention will become apparent from the following description of exemplary embodiments with reference to the attached drawings.

BRIEF DESCRIPTION OF THE DRAWINGS

FIG. 4 is a schematic diagram illustrating an evaluation method of the fine structure, using the photosensitive negative resin composition of the present embodiment.

DESCRIPTION OF THE EMBODIMENTS

Figure 1:
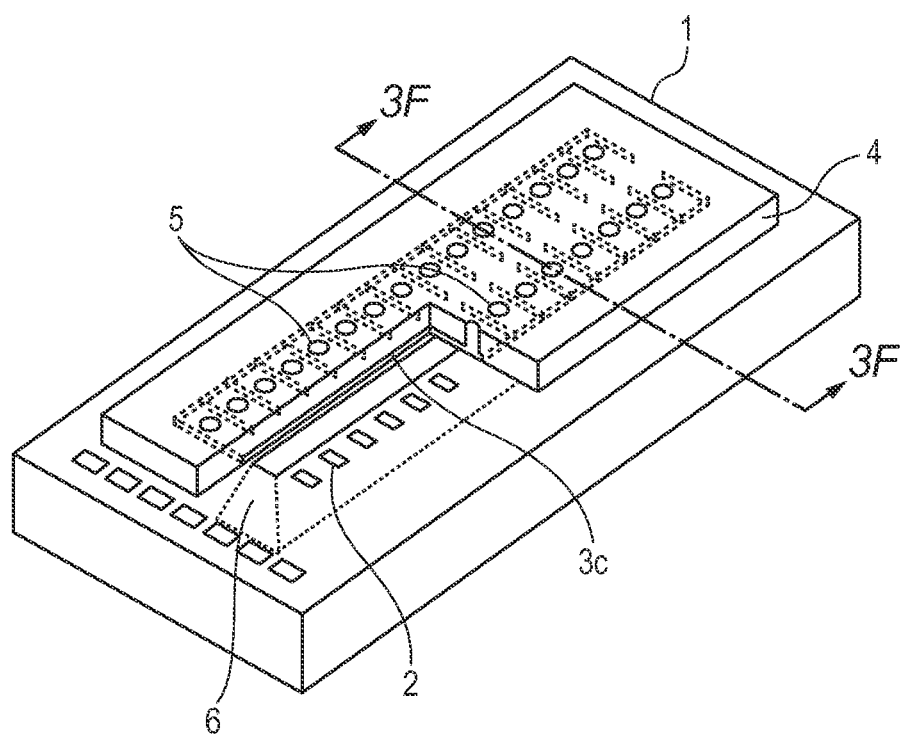
FIG. 1 is a schematic oblique perspective view illustrating a constitutional example of a liquid ejection head.

Preferred embodiments of the present invention will now be described in detail in accordance with the accompanying drawings.

In the case of the composition described in Japanese Patent Application Laid-Open No. 2008-256980 or Japanese Patent No. 3143307, for example, when an ejection orifice having a cylindrical shape of a liquid ejection device is formed by using a negative photosensitive resin with the i-line as a light source, the circularity of the ejection orifice obtained is insufficient, and hence an intended mask reproducibility is sometimes not obtained.

The present invention has been achieved in view of the foregoing, and an object of the present invention is to provide a photosensitive negative resin composition excellent in response precision and sensitivity when applied to photolithography.

Hereinafter, the photosensitive negative resin composition according to the present invention is described in detail.

(1) Photosensitive Negative Resin Composition

The respective components included in the photosensitive negative resin composition of the present invention are described in detail.

(a) Epoxy-Group-Containing Compound

The epoxy-group-containing compound (hereinafter, also abbreviated as the component (a)) is not particularly limited, but is preferably a polyfunctional epoxy resin compound capable of undergoing epoxy polymerization and containing a plurality of epoxy groups in a molecule thereof. Examples of such a polyfunctional epoxy resin include a polyfunctional alicyclic epoxy resin, a polyfunctional phenol/novolac epoxy resin, a polyfunctional ortho-cresol novolac epoxy resin, a polyfunctional triphenyl novolac epoxy resin and a polyfunctional bisphenol A novolac epoxy resin. Among these, the polyfunctional bisphenol A novolac epoxy resin, the polyfunctional alicyclic epoxy resin or the polyfunctional phenol/novolac epoxy resin is preferably used. The functionality concerned is preferably of five or more functionalities; for example, "EPICOAT 157S70" manufactured by Japan Epoxy Resins Co., Ltd., "EPICLON N-865" manufactured by Dainippon Ink and Chemicals Inc., and "EHPE 3150" manufactured by Dicel Chemical Industries, Ltd. are commercially available, and are more preferably used.

The softening point of the epoxy-group-containing compound is not particularly limited, but is preferably 40° C. or higher and more preferably 60° C. or higher. The softening point is also preferably 180° C. or lower and more preferably 160° C. or lower.

The content of the epoxy-group-containing compound is preferably 40 parts by mass or more, more preferably 50 parts by mass or more and furthermore preferably 65 parts by mass or more in relation to 100 parts by mass of the photosensitive negative resin composition. The content of the epoxy-group-containing compound is also preferably 99.9 parts by mass or less and more preferably 99.2 parts by mass or less in relation to 100 parts by mass of the photosensitive negative resin composition. With such a content as described above, when the photosensitive negative resin composition is applied to a substrate, a resist layer having a high sensitivity and an appropriate hardness is obtained.

(b) First Onium Salt

The first onium salt (hereinafter, also abbreviated as the component (b)) is constituted with a one-to-one combination of the cation moiety structure represented by formula (b1) and the anion moiety structure represented by formula (b2).

 (b1)

 (b2)

In the cation moiety structure represented by formula (b1), $R_1$ to $R_3$ each independently represent an organic group having 1 to 30 carbon atoms which may have a substituent. In the whole constituent atoms of $R_1$ to $R_3$, at least two or more oxygen atoms are included.

In the anion moiety structure represented by formula (b2), X is selected from the group consisting of a carbon atom, a nitrogen atom, a phosphorus atom, a boron atom and an antimony atom. Y is selected from the group consisting of —S(=O)$_2$—, an alkylene fluoride group, —O—CF$_2$—, —C(=O)—CF$_2$—, —O—C(=O)—CF$_2$—, —C(=O)—O—CF$_2$—, and a single bond. $R_4$ represents a hydrocarbon group having 1 to 30 carbon atoms which may be substituted with a fluorine atom. In the case where X represents a carbon atom, m and n represent integers that satisfy m+n=3 and n=0, 1, 2; in the case where X represents a nitrogen atom, m and n represent integers that satisfy m+n=2 and n=0, 1; in the case where X represents a phosphorus atom or an antimony atom, m and n represent integers that satisfy m+n=6 and n=0 to 6; in the case where X represents a boron atom, m and n represent integers that satisfy m+n=4 with n=0 to 3.

An example of (b1) and an example of (b2) are quoted below. The feature of the cation moiety structure represented by formula (b1) is derived from the inclusion of two or more oxygen atoms, which enables longer absorption wavelength of the component (b), and consequently has a high photosensitivity to the i-line or the like. On the other hand, the anion moiety structure represented by formula (b2) generates an acid derived from the structure of formula (b2) due to decomposition of the component (b1) after exposure to light. Subsequently, the action of the generated acid can start and promote cationic polymerization reaction of the epoxy group of the epoxy-group-containing compound. The generated acid preferably has an acid strength to sufficiently cure the epoxy-group-containing compound. The acid strength to sufficiently cure the epoxy-group-containing compound means an acid strength equal to or stronger than the acid strength of hexafluoroantimonic acid in terms of the Lewis acid, namely, a Hammet acidity function of HO=18 or more. In terms of the Broensted acid, the foregoing acid strength means a strong acid equivalent to or stronger than nonafluorobutanesulfonic acid, namely, pKa=−3.57 or more.

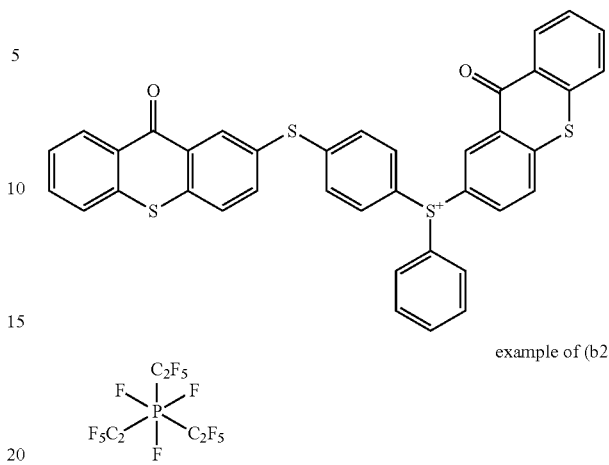

example of (b1)

example of (b2)

Preferable specific examples of the cation moiety structure represented by formula (b1) are given below.

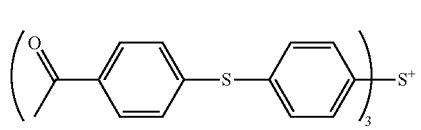

(b1-1)

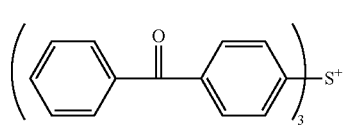

(b1-2)

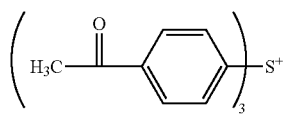

(b1-3)

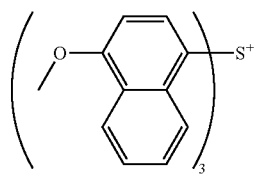

(b1-4)

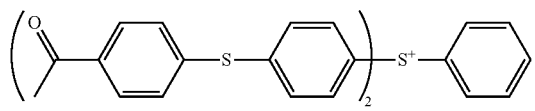

(b1-5)

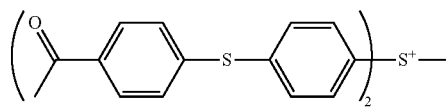

(b1-6)

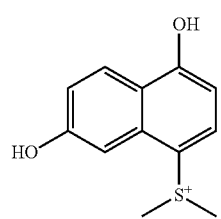

(b1-7)

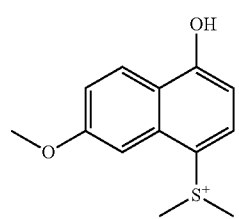

(b1-8)

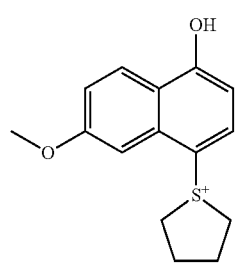

(b1-9)

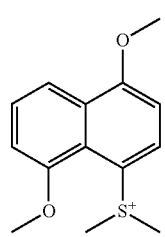

(b1-10)

-continued
(b1-11) 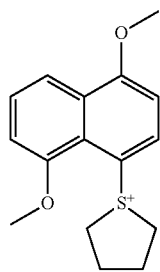
(b1-12) 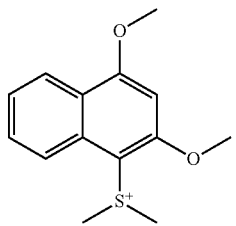
(b1-13) 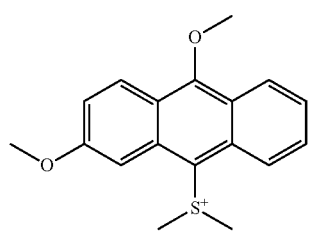
(b1-14) 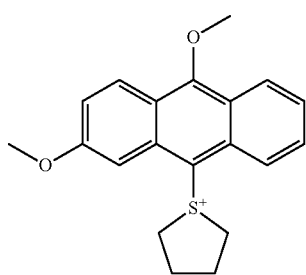
(b1-15) 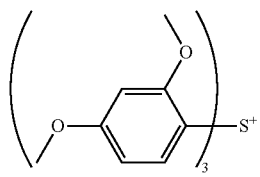
(b1-16) 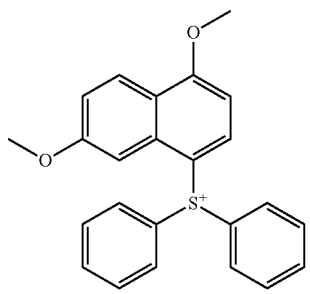
(b1-17) 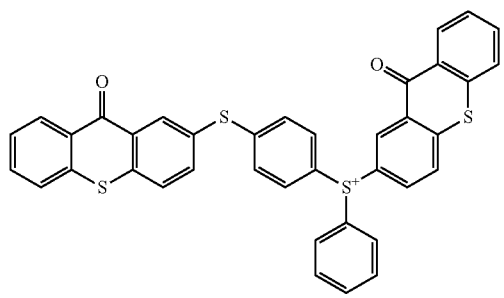
(b1-18) 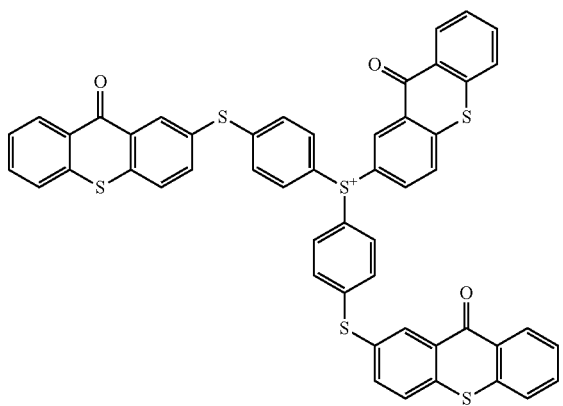

-continued
(b1-19)
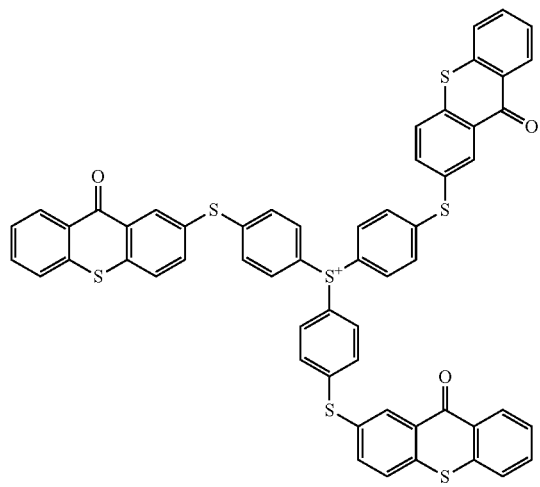
(b1-20)
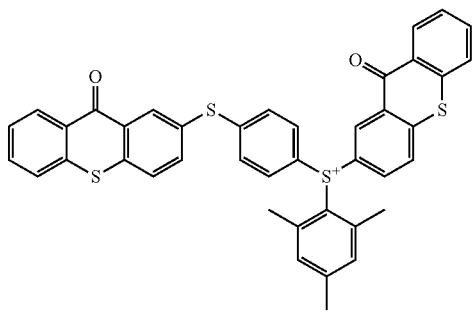
(b1-21)
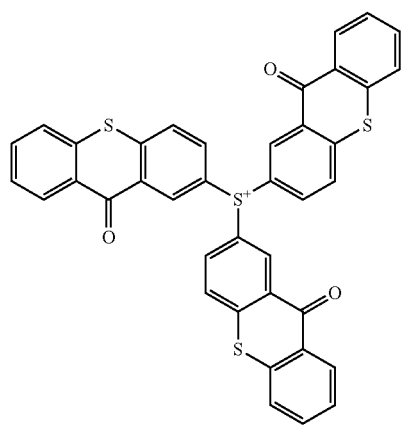
(b1-22)
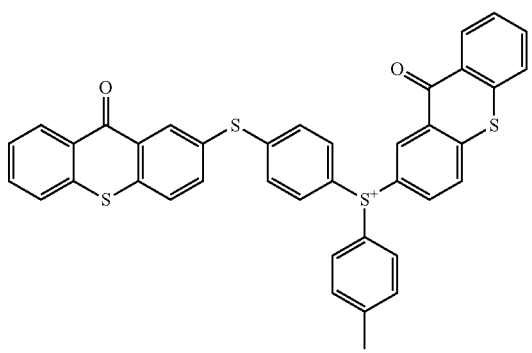
(b1-23)
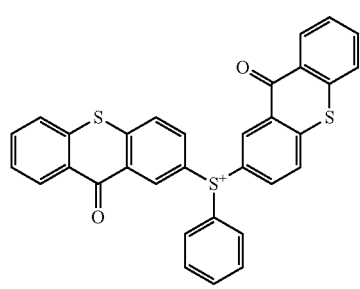
(b1-24)
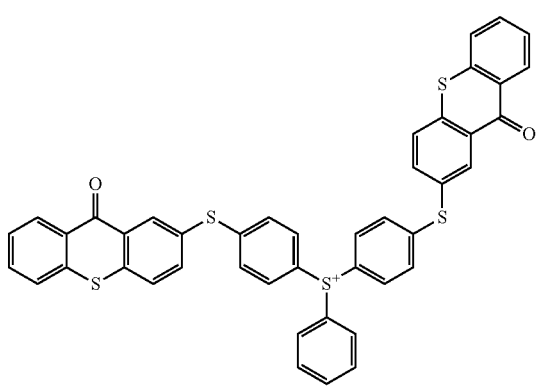
(b1-25)
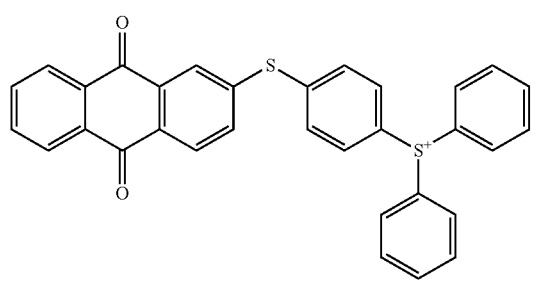
(b1-26)
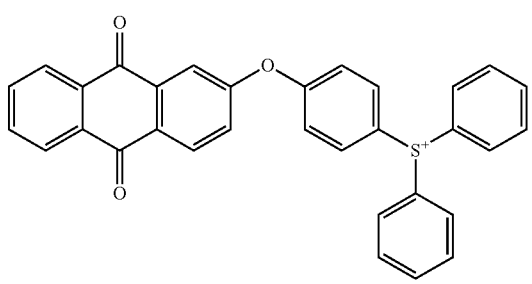

-continued
(b1-27)
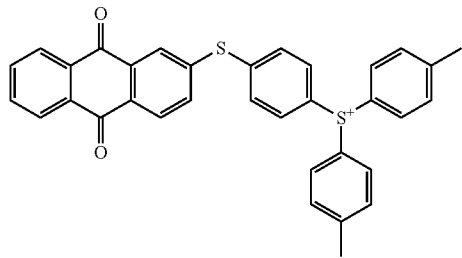
(b1-28)
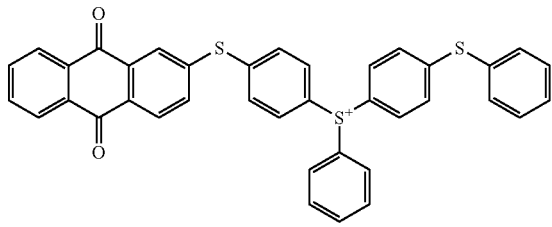
(b1-29)
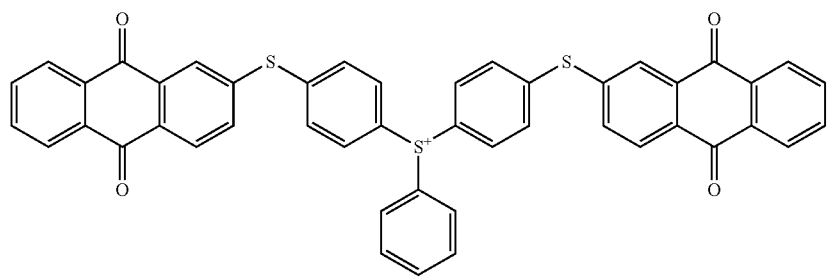
(b1-30)
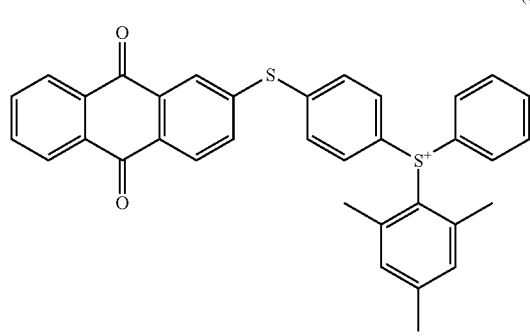
(b1-31)
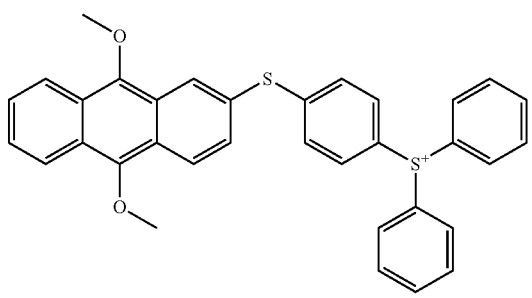
(b1-32)
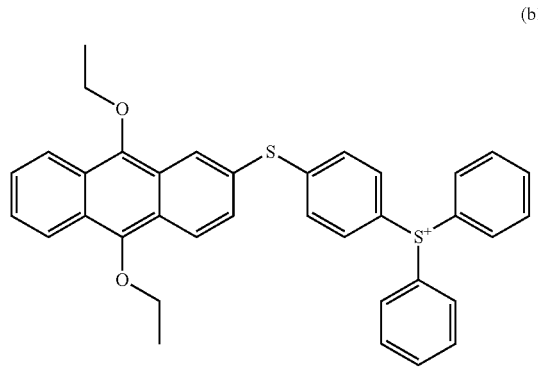
(b1-33)
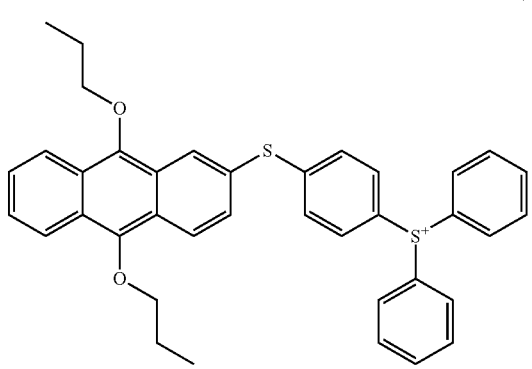

(b1-34)
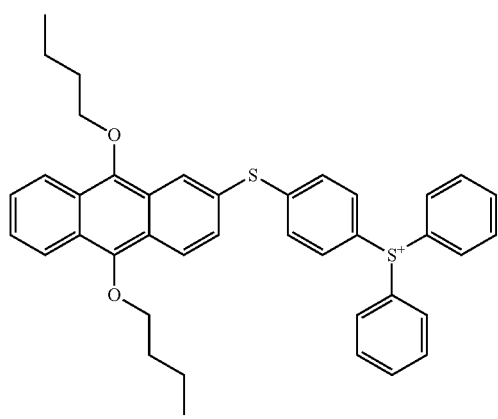
(b1-35)
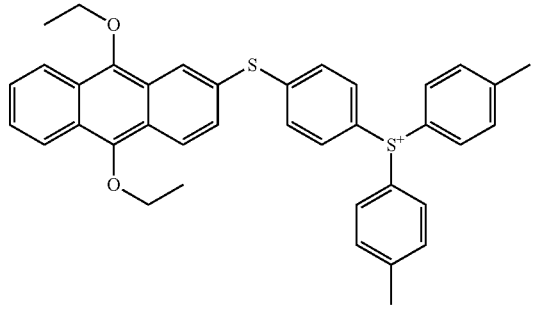
(b1-36)
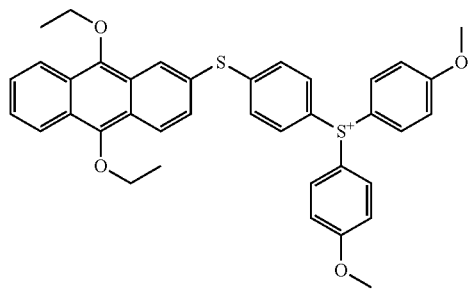
(b1-37)
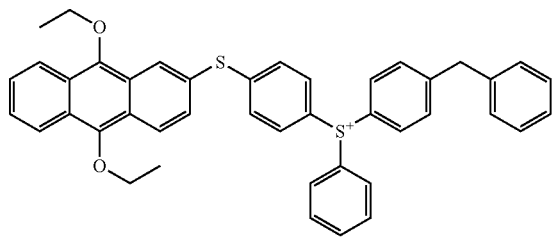
(b1-38)
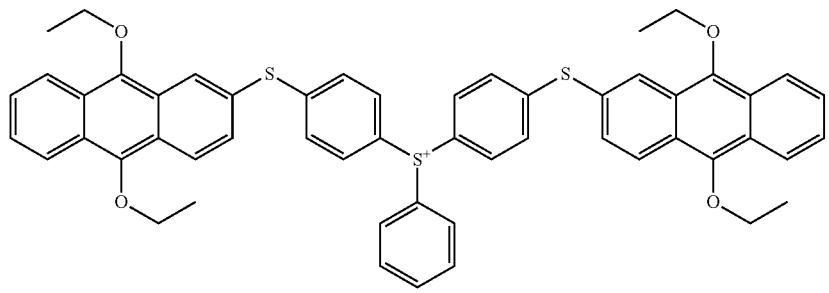
(b1-39)
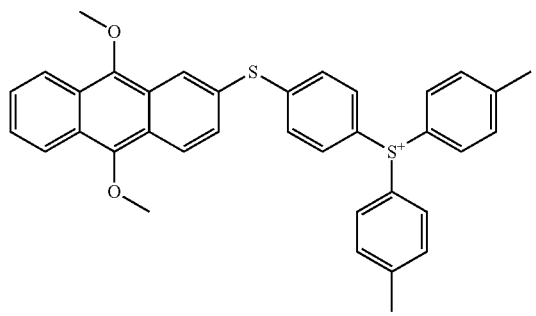
(b1-40)
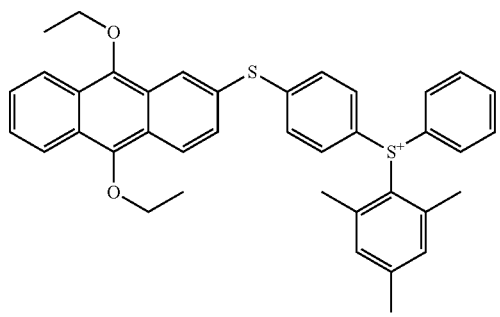

-continued (b1-41)

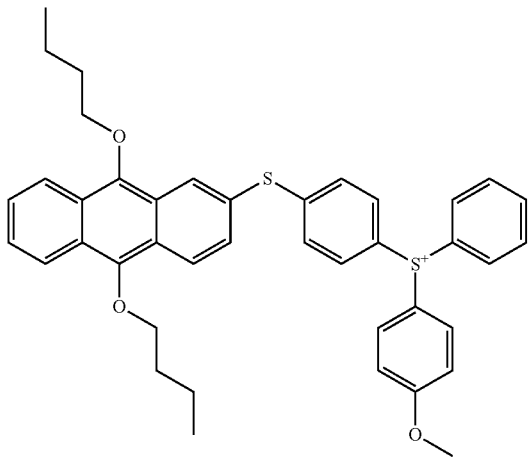

(b1-42)

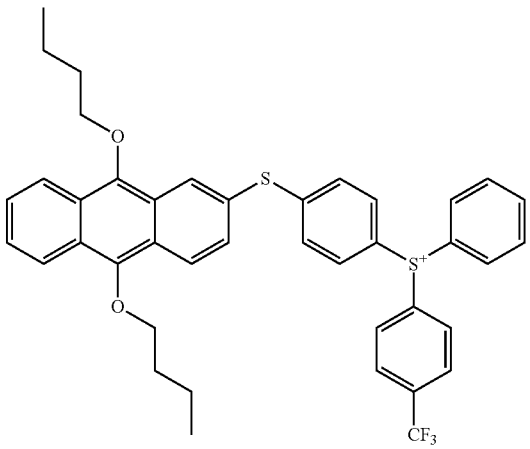

Among these, in view of having a high photosensitivity to the i-line, the cation moiety structures having a cyclic carbonyl structure are preferable; examples of $R_1$ to $R_3$ having a cyclic carbonyl structure include (b1-17) to (b1-30). Additionally, $R_1$ to $R_3$ each more preferably include a heterocyclic group containing a cyclic carbonyl structure; examples of $R_1$ to $R_3$ containing a heterocyclic ring group containing a cyclic carbonyl structure include the foregoing (b1-17) to (b1-24). At least one of $R_1$ to $R_3$ preferably includes a cyclic carbonyl structure, and two or more of $R_1$ to $R_3$ each more preferably include a cyclic carbonyl structure. The presence of a carbonyl group in a conjugated system significantly contributes to the longer wavelength of the absorption of the first onium salt (b), and in particular, the inclusion of an aromatic ring in a conjugated system improves the photosensitivity to the i-line.

In the cation moiety structure represented by formula (b1), as described above, it is enough that at least two or more oxygen atoms are included in the whole constituent atoms of $R_1$ to $R_3$, and thus one or two of $R_1$ to $R_3$ may each have a structure containing no oxygen. Hereinafter, the possible structures of $R_1$ to $R_3$ are described as examples. In the cation structure represented by formula (b1), the foregoing organic groups in $R_1$ to $R_3$ are, for example, an aryl group having 6 to 30 carbon atoms, a heterocyclic group having 4 to 30 carbon atoms, an alkyl group having 1 to 30 carbon atoms, an alkenyl group having 2 to 30 carbon atoms or an alkynyl group having 2 to 30 carbon atoms; these may be substituted with at least one selected from the group consisting of an alkyl group, a hydroxy group, a cycloalkyl group, an alkenyl group, an alkynyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heteroatom-containing aromatic ring group, an aryloxy group, an alkylsulfinyl group, an arylsulfinyl group, an alkylsulfonyl group, an arylsulfonyl group, an alkyleneoxy group, an amino group, a cyano group, an oxo group, a nitro group and halogen atoms. More specifically, examples of these substituents include: alkyl groups having 1 to 6 carbon atoms (such as a methyl group, an ethyl group, a propyl group, an isopropyl group and a butyl group), a hydroxy group, cycloalkyl groups having 3 to 6 carbon atoms (such as a cyclopropyl group, a cyclobutyl group, a cyclopentyl group and a cyclohexyl group), alkenyl groups having 2 to 6 carbon atoms (such as a vinyl group, a 1-propenyl group, a 2-propenyl group and a 2-butenyl group), alkynyl groups having 2 to 6 carbon atoms (such as an acetylenyl group, a 1-propynyl group, a 2-propynyl group and a 2-butynyl group), alkoxy groups having 1 to 6 carbon atoms (such as a methoxy group, an ethoxy group, an n-propoxy group, an iso-propoxy group, an n-butoxy group and a tert-butoxy group), alkylcarbonyl groups having 2 to 6 carbon atoms, arylcarbonyl groups having 7 to 11 carbon atoms, alkoxycarbonyl groups having 2 to 6 carbon atoms (such as a methoxycarbonyl group, an ethoxycarbonyl group and a tert-butoxycarbonyl group), aryloxycarbonyl groups having 7 to 11 carbon atoms, arylthiocarbonyl groups having 7 to 11 carbon atoms, acyloxy groups having 2 to 6 carbon atoms, arylthio groups having 6 to 10 carbon atoms (such as a phenylthio group and a naphthylthio group), alkylthio groups having 1 to 6 carbon atoms (such as a methylthio group, an ethylthio group, an n-propylthio group, an iso-propylthio group, an n-butylthio group and a tert-butylthio group), aryl groups having 6 to 14 carbon atoms (such as a phenyl group, a naphthyl group and an anthacenyl group), heteroatom-containing aromatic ring groups having 4 to 8 carbon atoms (such as a furyl group and a thienyl group), aryloxy groups having 6 to 10 carbon atoms (such as a phenoxy group and a naphthoxy group), alkyl sulfinyl groups having 1 to 6 carbon atoms, arylsulfinyl groups having 6 to 10 carbon atoms, alkylsulfonyl groups having 1 to 6 carbon atoms, arylsulfonyl groups having 6 to 10 carbon atoms, alkyleneoxy groups having 1 to 6 carbon atoms, an amino group, a cyano group, a nitro group and halogen atoms (such as a chlorine atom, a bromine atom and a fluorine atom). $R_1$ to $R_3$ may be the same as each other or different from each other. Two or more R's in $R_1$ to $R_3$ may be bonded to each other directly or through the intermediary of —O—, —S—, —SO—, —SO$_2$—, —NH—, —NR$_a$—, —CO—, —C(=O)O—, —C(=O)NH—, an alkylene having 1 to 3 carbon atoms or a phenylene group to form a cyclic structure. Here, $R_a$ is an alkyl group having 1 to 5 carbon atoms or an aryl group having 6 to 10 carbon atoms. It is to be noted that in the specification of the present application, an alkyl group includes a linear chain, a branched chain or a cyclic chain.

Preferable specific examples of the anion moiety structure represented by formula (b2) are given below.
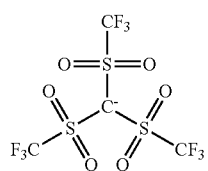
(b2-1)
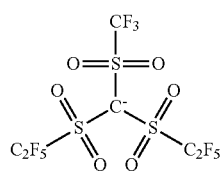
(b2-2)
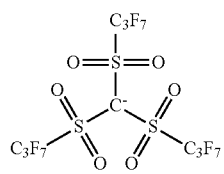
(b2-3)
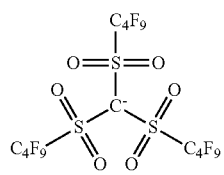
(b2-4)
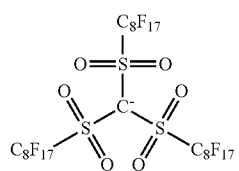
(b2-5)
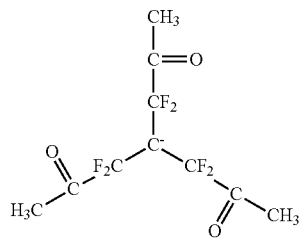
(b2-6)
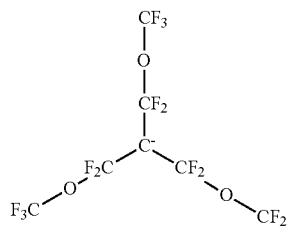
(b2-7)
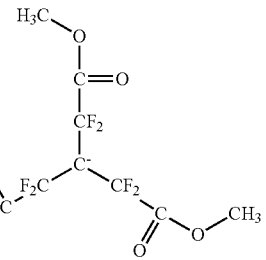
(b2-8)
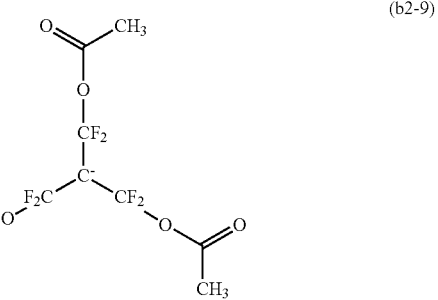
(b2-9)
(b2-10)
(b2-11)
(b2-12)
(b2-13)
(b2-14)
(b2-15)
(b2-16)
(b2-17)

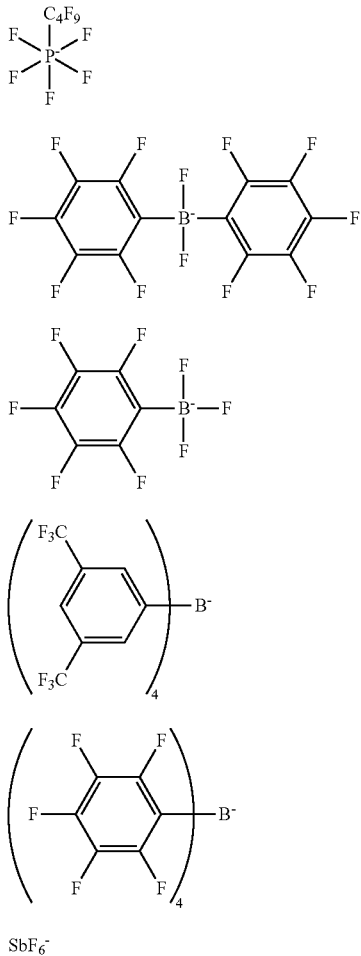

(b2-18)
(b2-19)
(b2-20)
(b2-21)
(b2-22)
(b2-23)

In the anion moiety structure represented by formula (b2), in the case where n=0 and Y is —S(=O)$_2$— or a single bond, $R_4$ is preferably a hydrocarbon group containing at least one fluorine atom. In the case where m is 2 or more, any of carbon atoms in one of $R_4$'s and any of carbon atoms in another one of $R_4$'s may be bonded to each other through the intermediary of a single bond to form a cyclic structure. $R_4$ is, for example, an alkyl group or an aryl group which may be substituted with a fluorine atom.

In the anion moiety structure represented by formula (b2), X is preferably a phosphorus atom, and examples of such a structure include the foregoing (b2-11) to (b2-18). In a case of a Lewis acid system, namely, in the case where X is an antimony atom or a phosphorus atom, the cured coating tends to be excellent in heat resistance. In the case where X is a phosphorus atom, the metal corrosiveness is lower than in the case where X is an antimony atom.

The component (b) can be used singly or in combination of two or more thereof.

The content of the component (b) is preferably 0.01 part by mass or more and more preferably 0.1 part by mass or more in relation to 100 parts by mass of the photosensitive negative resin composition. The content of the component (b) is preferably 20 parts by mass or less and more preferably 10 parts by mass or less.

(c) Second Onium Salt

The second onium salt (hereinafter, also abbreviated as the component (c)) is constituted with a one-to-one combination of the cation moiety structure represented by formula (c1) and the anion moiety structure represented by formula (c2).

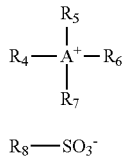

(c1)

(c2)

In the cation moiety structure represented by formula (c1), A represents a nitrogen atom or a phosphorus atom. $R_4$ to $R_7$ each independently represent an organic group having 1 to 15 carbon atoms which may have a substituent.

In the anion moiety structure represented by formula (c2), $R_8$ represents an organic group having 1 to 20 carbon atoms which may have a substituent.

In the present embodiment, it is important to include the second onium salt (c) in addition to the first onium salt (b). The reason for this is as follows. After exposure to light, the acid (b2) generated from the first onium salt (b) is a strong acid, which starts and promotes the cationic polymerization reaction of the epoxy group, and hence is, in this regard, suitable for the exposure to light. On the other hand, when the acid (b2) diffuses in the photosensitive negative resin composition, even the unexposed portion to be an ejection orifice is cured, and it comes to be sometimes difficult to form a stable ejection orifice shape. Accordingly, in the present embodiment, the second onium salt (c) is used which is constituted with the cation moiety structure represented by formula (c1) and the anion moiety structure represented by formula (c2). In particular, based on the assumption of an acid formed by imparting a proton to the anion moiety structure represented by formula (c2), the anion moiety structure represented by formula (c2) is found to have a structure incapable of undergoing epoxy polymerization, or a structure of a weak acid which is very weak in the acidity to bring about the polymerization. Accordingly, the encounter of the acid (b2) generated from the first onium salt (b) with the second onium salt (c) gives rise to a salt exchange to be converted into a weak acid incapable of undergoing epoxy polymerization or hardly capable of bringing about the polymerization. In other words, in the epoxy polymerization, the second onium salt (c) can function as a good quencher against the acid promoting the epoxy polymerization. The cation moiety structure represented by formula (c1) has a feature of being hardly decomposed even when exposed to light. Herewith, the decomposition of the second onium salt (c) at the time of exposure can be suppressed. As described above, the photosensitive negative resin composition of the present embodiment has an excellent response precision and an excellent sensitivity through the synergistic effects of the first onium salt and the second onium salt. Accordingly, the use of the photosensitive negative resin composition of the present embodiment enables to stably form a fine structure excellent in circularity, capable of corresponding to a wide range of radiations such as X-ray, EUV light, ArF laser beam, KrF laser beam, g-line, i-line, and electron beam.

An example of (c1) and an example of (c2) are quoted below.

example of (c1)

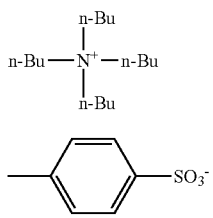

example of (c2)

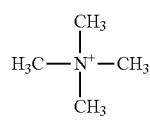

In the cation moiety structure represented by formula (c1), A represents a nitrogen atom or a phosphorus atom. In R4 to R7, the organic group is, for example, an aryl group having 6 to 15 carbon atoms, or an alkyl group having 1 to 15 carbon atoms, and these may be optionally substituted with at least one selected form the group consisting of an alkyl group, an alkyl fluoride group, a hydroxy group, a cycloalkyl group, an alkoxy group, an alkylcarbonyl group, an arylcarbonyl group, an arylthio group, an alkylthio group, an aryl group, an aryloxy group and halogen atoms. More specifically, examples of these substituents include: alkyl groups having 1 to 12 carbon atoms (such as a methyl group, an ethyl group, a propyl group, an isopropyl group and a butyl group), alkyl fluoride groups having 1 to 6 carbon atoms (such as a trifluoromethyl group and a pentafluoroethyl group), a hydroxy group, cycloalkyl groups having 3 to 6 carbon atoms (such as a cyclopropyl group, a cyclobutyl group, a cyclopentyl group and a cyclohexyl group), alkoxy groups having 1 to 6 carbon atoms (such as a methoxy group, an ethoxy group, an n-propoxy group, an iso-propoxy group, an n-butoxy group and a tert-butoxy group), alkylcarbonyl groups having 2 to 6 carbon atoms, arylcarbonyl groups having 7 to 11 carbon atoms, arylthio groups having 6 to 10 carbon atoms (such as a phenylthio group and a naphthylthio group), alkylthio groups having 1 to 6 carbon atoms (such as a methylthio group, an ethylthio group, an n-propylthio group, an iso-propylthio group, an n-butylthio group and a tert-butylthio group), aryl groups having 6 to 10 carbon atoms (such as a phenyl group and a naphthyl group), aryloxy groups having 6 to 10 carbon atoms (such as a phenoxy group and a naphthoxy group) and halogen atoms (such as a chlorine atom, a bromine atom and a fluorine atom). R4 to R7 may be the same as each other or different from each other. Two or more R's in R4 to R7 may be bonded to each other directly or through the intermediary of an alkylene having 1 to 3 carbon atoms and a nitrogen atom to form a heterocyclic structure.

Preferable specific examples of the cation moiety structure represented by formula (c1) are given below.

(c1-1)

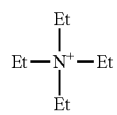

(c1-2)

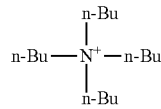

(c1-3)

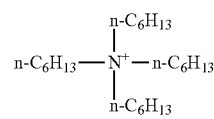

(c1-4)

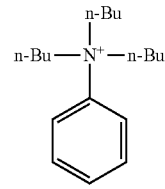

(c1-5)

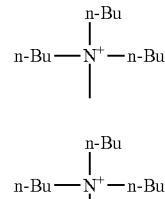

(c1-6)

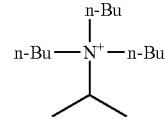

(c1-7)

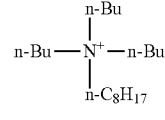

(c1-8)

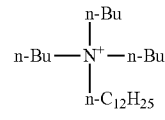

(c-9)

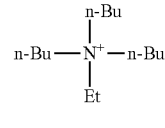

(c1-10)

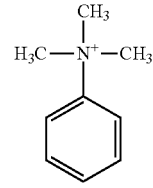

(c1-11)

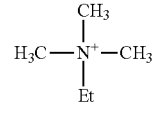

(c1-12)

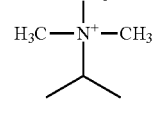

(c1-13)

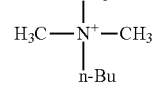

(c1-14)

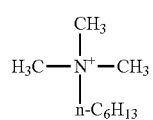 (c1-15)
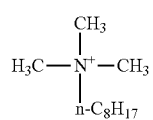 (c1-16)
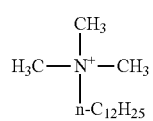 (c-117)
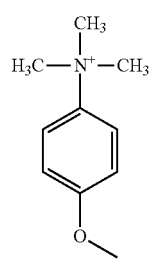 (c-18)
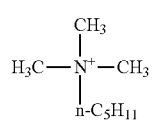 (c1-19)
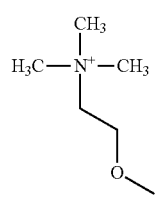 (c1-20)
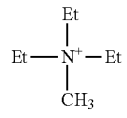 (c1-21)
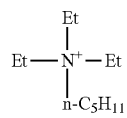 (c1-22)
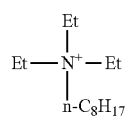 (c1-23)
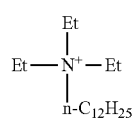 (c1-24)
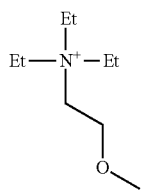 (c1-25)
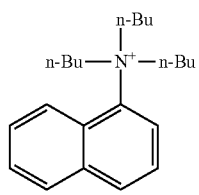 (c1-26)
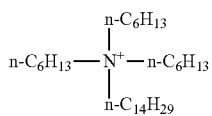 (c1-27)
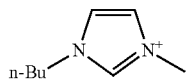 (c1-28)
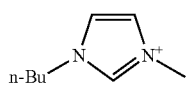 (c1-29)
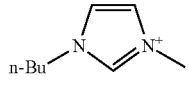 (c1-30)
 (c1-31)
 (c1-32)
 (c1-33)
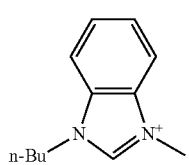 (c1-34)
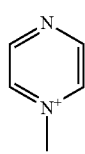 (c1-35)

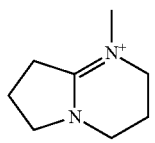 (c1-36)
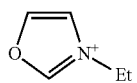 (c1-37)
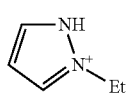 (c1-38)
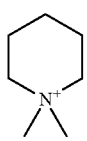 (c1-39)
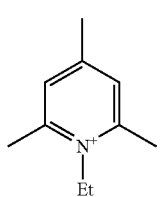 (c1-40)
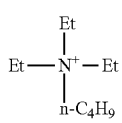 (c1-41)
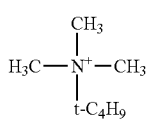 (c1-42)
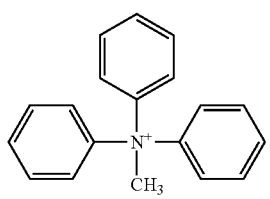 (c1-43)
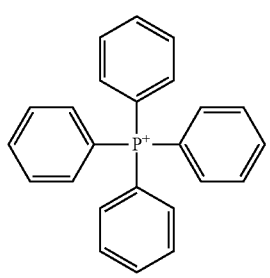 (c1-44)
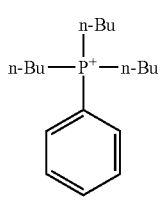 (c1-45)
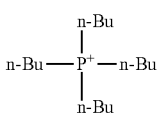 (c1-46)
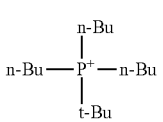 (c1-47)
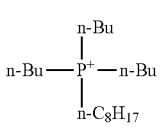 (c1-48)
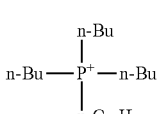 (c1-49)
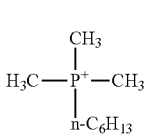 (c1-50)
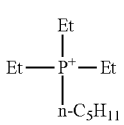 (c1-51)
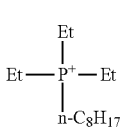 (c1-52)
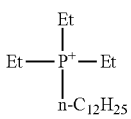 (c1-53)
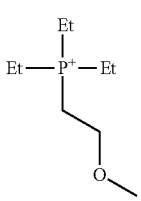 (c1-54)
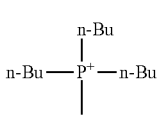 (c1-55)
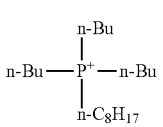 (c1-56)
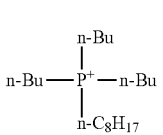 (c1-57)

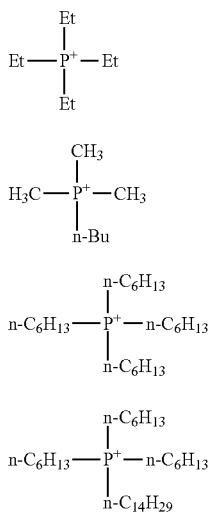

In the anion moiety structure represented by formula (c2), the foregoing organic group in $R_8$ is, for example, a hydrocarbon group having 1 to 20 carbon atoms, and more preferably, for example, an alkyl group having 1 to 20 carbon atoms or an aryl group having 6 to 20 carbon atoms, and these may be optionally substituted with at least one selected from the group consisting of, for example, an alkyl group, an oxo group, a cycloalkyl group, an alkoxy group and an alkylcarbonyl group. More specifically, examples of these substituents include: alkyl groups having 1 to 10 carbon atoms (such as a methyl group, an ethyl group, a propyl group, an isopropyl group and a butyl group), cycloalkyl groups having 3 to 6 carbon atoms (such as a cyclopropyl group, a cyclobutyl group, a cyclopentyl group and a cyclohexyl group), alkoxy groups having 1 to 6 carbon atoms (such as a methoxy group, an ethoxy group, an n-propoxy group, an iso-propoxy group, an n-butoxy group and a tert-butoxy group) and alkylcarbonyl groups having 2 to 6 carbon atoms. In $R_8$, two or more carbon atoms may be bonded to each other directly or through the intermediary of an alkylene having 1 to 3 carbon atoms to form a cyclic structure. The cyclic structure may be monocyclic or polycyclic.

Preferable specific examples of the anion moiety structure represented by formula (c2) are given below.

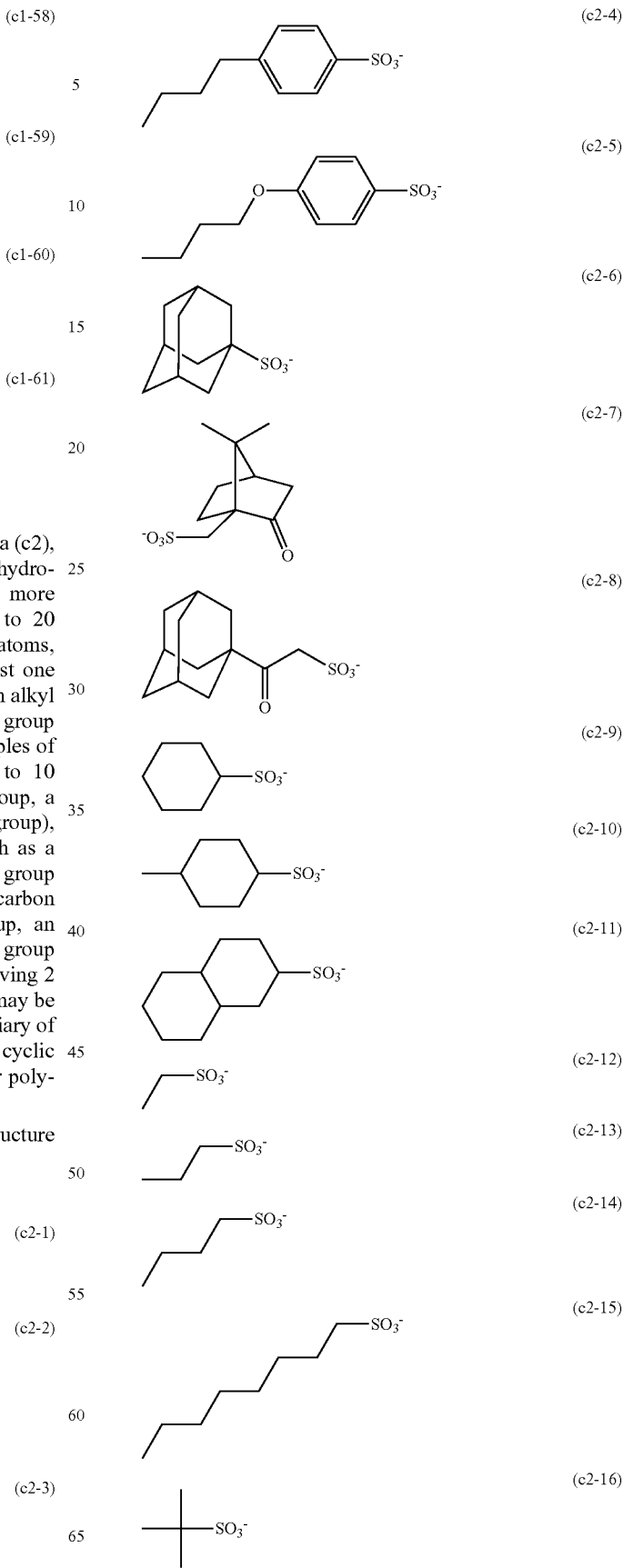

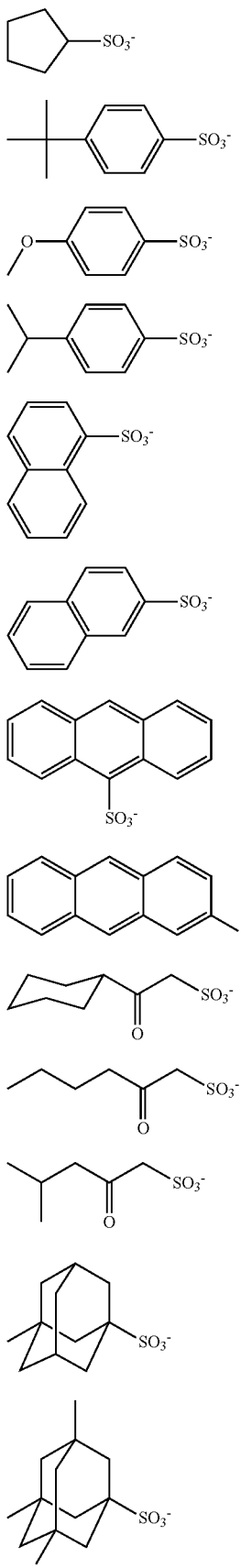

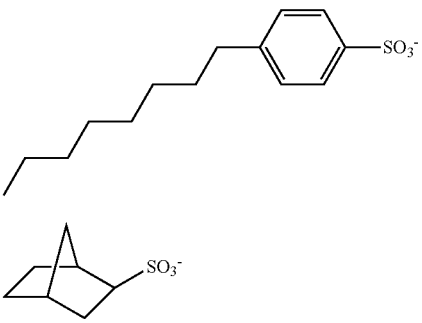

In the anion moiety structure represented by formula (c2), $R_8$ is preferably a structure including an aromatic hydrocarbon or an alicyclic hydrocarbon. In the case of the structure including an aromatic hydrocarbon or an alicyclic hydrocarbon, the bulkiness or the carbon density thereof results in the suppression of the volatilization and evaporation into the atmosphere of the acid generated from the anion represented by formula (c2) during a heating process. Specific examples of the anion moiety structure having $R_8$ including an aromatic hydrocarbon or an alicyclic hydrocarbon include: the foregoing (c2-1) to (c2-11), (c2-17) to (c2-25), and (c2-28) to (c2-31).

The component (c) can be used singly or in combination of two or more thereof.

The content of the component (c) is preferably 0.001 part by mass or more in relation to 100 parts by mass of the photosensitive negative resin composition. The content of the component (c) is preferably 5 parts by mass or less and more preferably 4 parts by mass or less.

The mixing amounts of the component (b) and the component (c) in the photosensitive negative resin composition preferably satisfy the following relation.

Number of moles of the first onium salt($b$)>Number of moles of the second onium salt($c$)

In the case where this relation is satisfied, the state that the component (b) generating the acid effective for the epoxy polymerization is larger in amount than the component (c) functioning as a quencher is brought about, and thus the high sensitivity can be achieved.

The mixing amounts of the component (b) and the component (c) in the photosensitive negative resin composition more preferably satisfy the following relation.

Number of moles of the first onium salt($b$)× 0.7>Number of moles of the second onium slat ($c$)>Number of moles of the first onium salt($b$)× 0.02

By increasing the addition amount of the second onium salt so as to make the number of moles of the second onium slat (c) larger than the number of moles of the first onium salt (b)×0.02, the effect of the second onium salt as a quencher can be sufficiently obtained.

(d) Third Onium Salt

The third onium salt (hereinafter, also abbreviated as the component (d)) is constituted with a one-to-one combination of the cation moiety structure represented by formula (d1) and the anion moiety structure represented by formula (d2).

In the cation moiety structure represented by formula (d1), $R_9$ and $R_{10}$ each independently represent an aryl group having 6 to 15 carbon atoms which may have a substituent.

In the anion moiety structure represented by formula (d2), Z is selected from the group consisting of a carbon atom and a sulfur atom. In the case where Z is a carbon atom, k=1; in the case where Z is a sulfur atom, k=2. $R_{11}$ represents an organic group having 1 to 20 carbon atoms which may have a substituent.

In the present embodiment, it is important to include the third onium salt (d) in addition to the first onium salt (b). The reason for this is as follows. After exposure with the i-line or the like, the acid (b2) generated from the first onium salt (b) is a strong acid, which starts and promotes the cationic polymerization reaction of the epoxy group, and hence is, in this regard, suitable for the exposure to light. On the other hand, when the acid (b2) diffuses in the photosensitive negative resin composition, even the unexposed portion to be an ejection orifice is cured, and it comes to be sometimes difficult to form a stable ejection orifice shape. Accordingly, in the present embodiment, the third onium salt (d) is used which is constituted with the cation moiety structure represented by formula (d1) and the anion moiety structure represented by formula (d2). In particular, based on the assumption of an acid formed by imparting a proton to the anion moiety structure represented by formula (d2), the anion moiety structure represented by formula (d2) is found to have a structure incapable of undergoing epoxy polymerization, or a structure of a weak acid which is very weak in the acidity to bring about the polymerization. Accordingly, the encounter of the acid (b2) generated from the first onium salt (b) with the third onium salt (d) gives rise to a salt exchange to be converted into a weak acid incapable of undergoing epoxy polymerization or hardly capable of bringing about the polymerization. In other words, in the epoxy polymerization, the third onium salt (d) can function as a good quencher against the acid promoting the epoxy polymerization. The cation moiety structure represented by formula (d1) has a feature of having a low photosensitivity to the i-line or the like. Herewith, the decomposition of the third onium salt (d) at the time of exposure to the i-line can be suppressed. As described above, the photosensitive negative resin composition of the present embodiment has an excellent response precision and an excellent sensitivity through the synergistic effects of the first onium salt and the third onium salt. Accordingly, the use of the photosensitive negative resin composition of the present embodiment enables to stably form a fine structure excellent in circularity, capable of corresponding to the i-line.

An example of (d1) and an example of (d2) are quoted below.

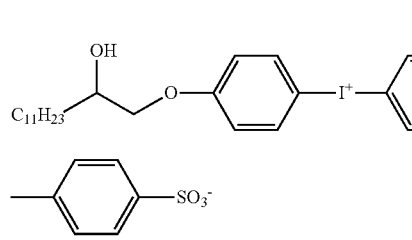

example of (d1)

example of (d2)

In the cation moiety structure represented by formula (d1), the aryl group of $R_9$ and $R_{10}$ (such as a phenyl group or a naphthyl group) may be optionally substituted with at least one selected from the group consisting of an alkyl group, an alkyl fluoride group, a hydroxy group, a cycloalkyl group, an alkoxy group, an alkylcarbonyl group, an arylcarbonyl group, an arylthio group, an alkylthio group, an aryl group, an aryloxy group and halogen atoms. More specifically, examples of these substituents include: alkyl groups having 1 to 12 carbon atoms (such as a methyl group, an ethyl group, a propyl group, an isopropyl group and a butyl group), alkyl fluoride groups having 1 to 6 carbon atoms (such as a trifluoromethyl group and a pentafluoroethyl group), a hydroxy group, cycloalkyl groups having 3 to 6 carbon atoms (such as a cyclopropyl group, a cyclobutyl group, a cyclopentyl group and a cyclohexyl group), alkoxy groups having 1 to 13 carbon atoms (such as a methoxy group, an ethoxy group, an n-propoxy group, an iso-propoxy group, an n-butoxy group and a tert-butoxy group), alkylcarbonyl groups having 2 to 6 carbon atoms, arylcarbonyl groups having 7 to 11 carbon atoms, arylthio groups having 6 to 10 carbon atoms (such as a phenylthio group and a naphthylthio group), alkylthio groups having 1 to 6 carbon atoms (such as a methylthio group, an ethylthio group, an n-propylthio group, an iso-propylthio group, an n-butylthio group and a tert-butylthio group), aryl groups having 6 to 10 carbon atoms (such as a phenyl group and a naphthyl group), aryloxy groups having 6 to 10 carbon atoms (such as a phenoxy group and a naphthoxy group) and halogen atoms (such as a chlorine atom, a bromine atom and a fluorine atom). At least one of the hydrogen atoms in each of the following substituents may be substituted with a hydroxy group: the alkyl group, the alkyl fluoride group, the cycloalkyl group, the alkoxy group, the alkylcarbonyl group, the arylcarbonyl group, the arylthio group, the alkylthio group, the aryl group and the aryloxy group. $R_9$ and $R_{10}$ may be the same as each other or different from each other.

Preferable specific examples of the cation moiety structure represented by formula (d1) are given below.

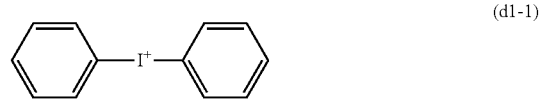

(d1-1)

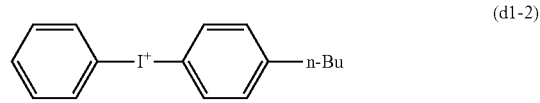

(d1-2)

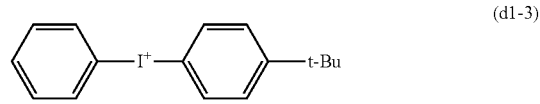

(d1-3)

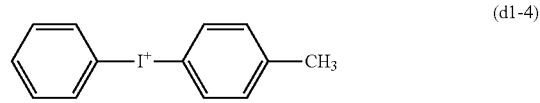

(d1-4)

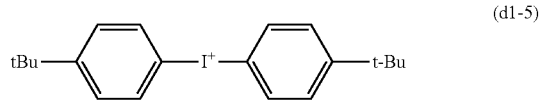

(d1-5)

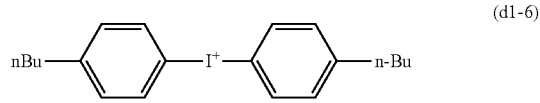

(d1-6)

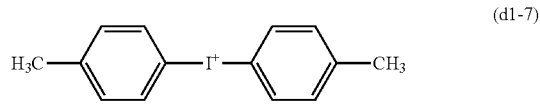

(d1-7)

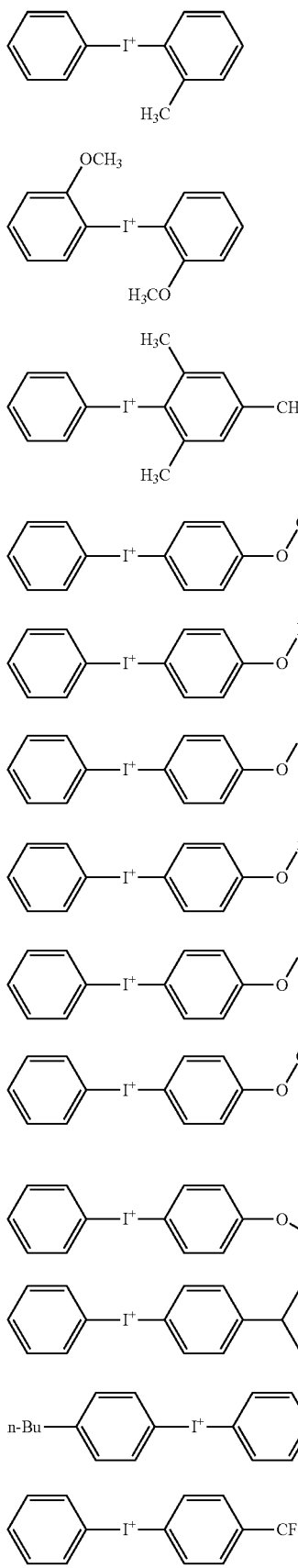
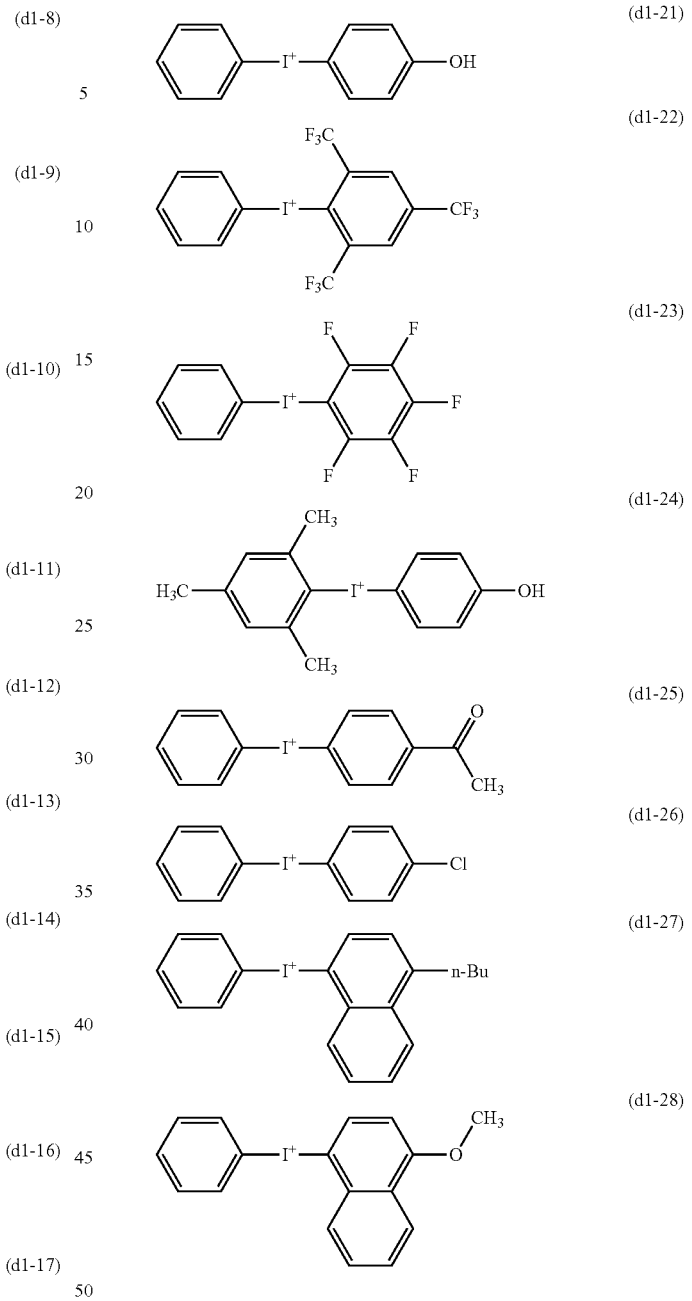

In the anion moiety structure represented by formula (d2), the foregoing organic group in $R_{11}$ is, for example, a hydrocarbon group having 1 to 20 carbon atoms, and more preferably, for example, an alkyl group having 1 to 20 carbon atoms or an aryl group having 6 to 20 carbon atoms, and these may be optionally substituted with at least one selected from the group consisting of, for example, an alkyl group, an oxo group, a cycloalkyl group, an alkoxy group and an alkylcarbonyl group. More specifically, examples of these substituents include: alkyl groups having 1 to 10 carbon atoms (such as a methyl group, an ethyl group, a propyl group, an isopropyl group and a butyl group), cycloalkyl groups having 3 to 6 carbon atoms (such as a cyclopropyl group, a cyclobutyl group, a cyclopentyl group and a cyclohexyl group), alkoxy groups having 1 to 6 carbon atoms (such as a methoxy group, an ethoxy group, an n-propoxy group, an iso-propoxy group, an n-butoxy group and a tert-butoxy group) and alkylcarbonyl groups having 2 to 6 carbon atoms. In $R_{11}$, two or more carbon atoms may be bonded to each other directly or through the intermediary of an alkylene having 1 to 3 carbon atoms to form a cyclic structure. The cyclic structure may be monocyclic or polycyclic.

Preferable specific examples of the anion moiety structure represented by formula (d2) are given below.

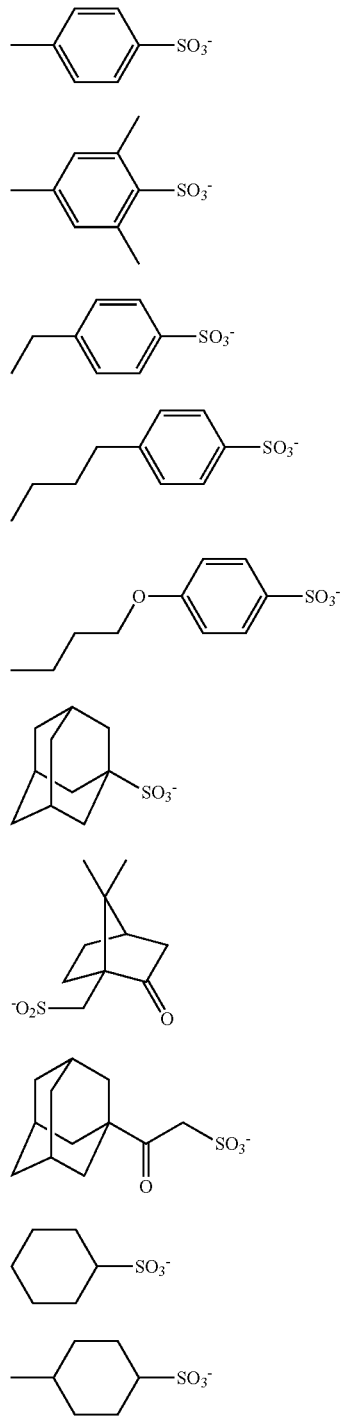

(d2-1)
(d2-2)
(d2-3)
(d2-4)
(d2-5)
(d2-6)
(d2-7)
(d2-8)
(d2-9)
(d2-10)

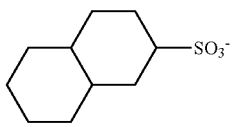

(d2-11)

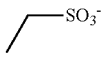

(d2-12)

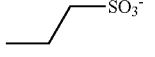

(d2-13)

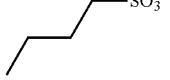

(d2-14)

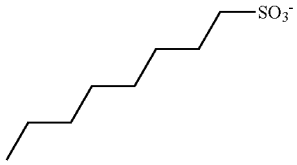

(d2-15)

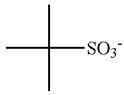

(d2-16)

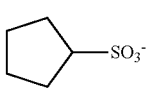

(d2-17)

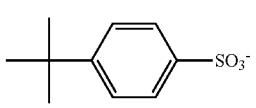

(d2-18)

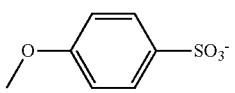

(d2-19)

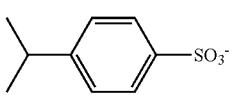

(d2-20)

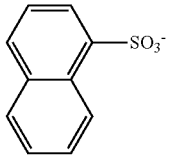

(d2-21)

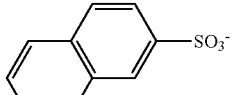

(d2-22)

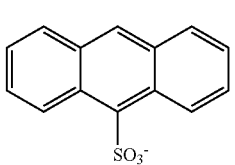

(d2-23)

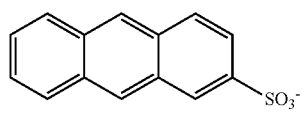 (d2-24)
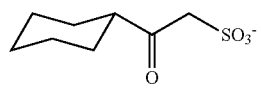 (d2-25)
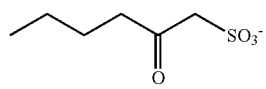 (d2-26)
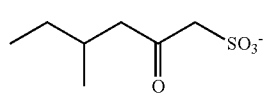 (d2-27)
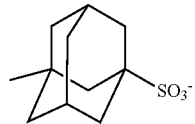 (d2-28)
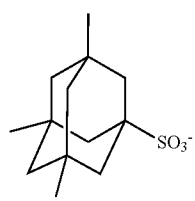 (d2-29)
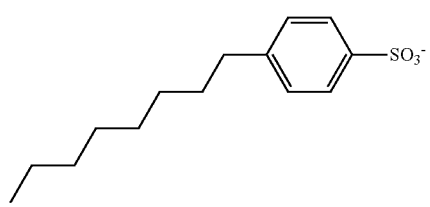 (d2-30)
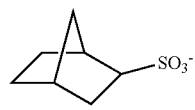 (d2-31)
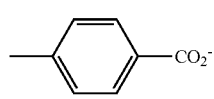 (d2-32)
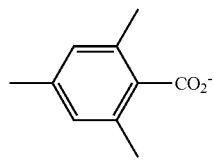 (d2-33)
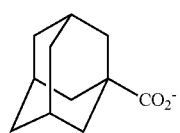 (d2-34)
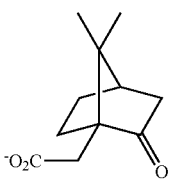 (d2-35)
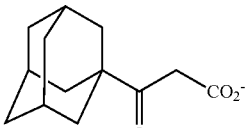 (d2-36)
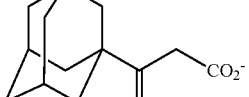 (d2-37)
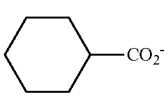 (d2-38)
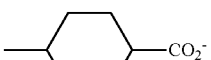 (d2-39)
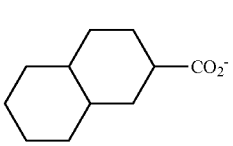 (d2-40)
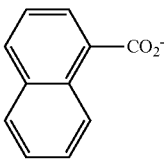 (d2-41)
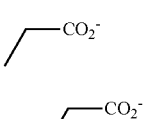 (d2-42)
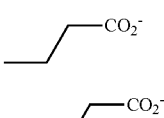 (d2-43)
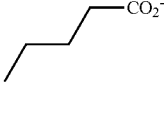 (d2-44)
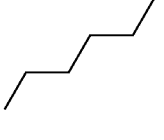 (d2-45)
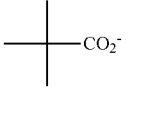 (d2-46)
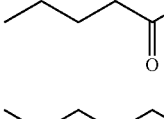 (d2-47)

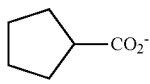 (d2-48)

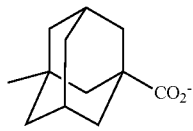 (d2-49)

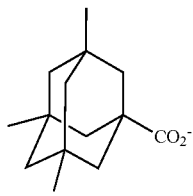 (d2-50)

(d2-51)

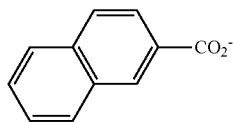 (d2-52)

(d2-53)

(d2-54)

(d2-55)

(d2-56)

In the anion moiety structure represented by formula (d2), $R_{11}$ is preferably a structure including an aromatic hydrocarbon or an alicyclic hydrocarbon. In the case of the structure including an aromatic hydrocarbon or an alicyclic hydrocarbon, the bulkiness or the carbon density thereof results in the suppression of the volatilization and evaporation into the atmosphere of the acid generated from the anion represented by formula (d2) during a heating process. Specific examples of the anion moiety structure having $R_{11}$ including an aromatic hydrocarbon or an alicyclic hydrocarbon include: the foregoing (d2-1) to (d2-11), (d2-17) to (d2-25), (d2-28) to (d2-31), (d2-32) to (d2-40), and (d2-48) to (d2-56).

In the anion moiety structure represented by formula (d2), Z is preferably a sulfur atom. In the case where Z is a sulfur atom, the anion can be more stabilized as compared to the case where Z is a carbon atom. Consequently, the nucleophilicity of the anion moiety is suppressed, and the decomposition of the third onium salt due to the nucleophilic attack of the anion moiety against the cation moiety (d1) can be suppressed.

The component (d) can be used singly or in combination of two or more thereof.

The content of the component (d) is preferably 0.001 part by mass or more in relation to 100 parts by mass of the photosensitive negative resin composition. The content of the component (d) is preferably 5 parts by mass or less and more preferably 4 parts by mass or less.

The mixing amounts of the component (b) and the component (d) in the photosensitive negative resin composition preferably satisfy the following relation.

Number of moles of the first onium salt($b$)>Number of moles of the third onium salt($d$)

In the case where this relation is satisfied, the state that the component (b) generating the acid effective for the epoxy polymerization is larger in amount than the component (d) functioning as a quencher is brought about, and thus the high sensitivity can be achieved.

The mixing amounts of the component (b) and the component (d) in the photosensitive negative resin composition more preferably satisfy the following relation.

Number of moles of the first onium salt($b$)× 0.7>Number of moles of the third onium salt($d$) >Number of moles of the first onium salt($b$)× 0.02

By increasing the addition amount of the third onium salt so as to make the number of moles of the third onium slat (d) larger than the number of moles of the first onium salt (b)×0.02, the effect of the third onium salt as a quencher can be sufficiently obtained.

The photosensitive negative resin composition of the present embodiment may include a fourth onium salt (e) other than the first onium salt (b), the second onium salt (c) and the third onium salt (d). Examples of the fourth onium salt (e) include an onium salt including a cation moiety structure of (b1) in which one or less oxygen atom is included in the whole constituent atoms of $R_1$ to $R_3$ and an anion moiety structure represented by the foregoing (b2). In this case, the content of the fourth onium salt (e) is preferably 0.001 part by mass or more and more preferably 0.005 part by mass or more, in relation to 100 parts by mass of the photosensitive negative resin composition. The content of the fourth onium salt (e) is preferably 25 parts by mass or less and more preferably 15 parts by mass or less.

Silane Compound

The photosensitive negative resin composition of the present embodiment may include a silane compound.

The silane compound is not particularly limited as long as the silane compound is a silicon-atom-containing compound, but is preferably an organosilane compound having a function to improve or help the adhesion between the photosensitive negative resin composition and a substrate. Examples of such an organosilane compound include: epoxy-group-containing organosilane compounds such as γ0 glycidoxypropyltrimethoxysilane, γ-glycidoxypropylmethyldiethoxysilane, γ-glycidoxypropyltriethoxysilane and β-(3,4-epoxycyclohexyl)ethyltrimethoxysilane; amino-group-containing organosilane compounds such as N-β (aminoethyl)-γ-aminopropyltrimethoxysilane, N-β(aminoethyl)-γ-aminopropyltriethoxysilane, γ-β(aminoethyl)-3-aminopropylmethyldimethoxysilane, γ-aminopropyltrimethoxysilane, γ-aminopropyltriethoxysilane, N-phenyl-γ-aminopropyltrimethoxysilane, N-phenyl-γ-aminopropyltriethoxysilane, γ-triethoxysilyl-N-(1,3-dimethyl-butylidene)propylamine and N-(vinylbenzyl)-β-aminoethyl-γ-aminopropyltrimethoxysilane; isocyanate-group-containing organosilane compounds such as 3-isocyanatepropyltrimethoxysilane and 3-isocyanatepropyltriethoxysilane; and mercapto-group-containing organosilane compounds such as γ-mercaptopropyltrimethoxysilane, γ-mercaptopropylmethyldimethoxysilane and γ-mercaptopropyltriethoxysilane.

It is preferable to use as the silane compound an epoxy-group-containing organosilane compound from the viewpoint of the adhesion between an inorganic substrate and the epoxy resin coating. As the epoxy-group-containing silane compound, for example, SILQUEST A-187 SILANE (trade name, manufactured by Momentive Performance Materials Japan LLC) is commercially available and particularly preferably used.

The content of the silane compound in the photosensitive negative resin composition is preferably 0.1 part by mass or more and more preferably 0.5 part by mass or more in relation to 100 parts by mass of the photosensitive negative resin composition, from the viewpoint of adhesion. The content of the silane compound is preferably 20 parts by mass or less and more preferably 15 parts by mass or less in relation to 100 parts by mass of the photosensitive negative resin composition, from the viewpoint of obtaining the toughness of the cured product.

The silane compounds may be used singly or in combination of two or more thereof.

Solvent

The solvent is not particularly limited, but is preferably an organic solvent capable of dissolving the individual components used in preparation of the photosensitive negative resin composition. Examples of such a solvent include: organic solvents such as alkylene glycol monoalkyl ether carboxylates, alkylene glycol monoalkyl ethers, alkyl lactates, alkyl alkoxypropionates, cyclic lactones (preferably having 4 to 10 carbon atoms), monoketone compounds which may have rings (preferably having 4 to 10 carbon atoms), alkylene carbonates, alkyl alkoxyacetates, alkyl pyruvates and benzene-ring-containing compounds.

Preferable examples of the alkylene glycol monoalkyl ether carboxylates include: propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethylether propionate, ethylene glycol monomethyl ether acetate and ethylene glycol monoethyl ether acetate.

Preferable examples of the alkylene glycol monoalkyl ethers include: propylene glycol monomethyl ether, propylene glycol monoethylether, propylene glycol monopropyl ether, propylene glycol monobutyl ether, ethylene glycol monomethyl ether and ethylene glycol monoethyl ether.

Preferable examples of the alkyl lactates include: methyl lactate, ethyl lactate, propyl lactate and butyl lactate.

Preferable examples of the alkyl alkoxypropionates include: ethyl 3-ethoxypropionate, methyl 3-methoxypropionate, methyl 3-ethoxypropionate and ethyl 3-methoxypropionate.

Preferable examples of the cyclic lactones include: β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferable examples of the monoketone compounds which may have rings include: 2-butanone, 3-methyl butanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methyl cyclopentanone, 3-methyl cyclopentanone, 2,2-dimethyl cyclopentanone, 2,4,4-trimethyl cyclopentanone, cyclohexanone, 3-methyl cyclohexanone, 4-methyl cyclohexanone, 4-ethyl cyclohexanone, 2,2-dimethyl cyclohexanone, 2,6-dimethyl cyclohexanone, 2,2,6-trimethyl cyclohexanone, cycloheptanone, 2-methyl cycloheptanone and 3-methyl cycloheptanone.

Preferable examples of the alkylene carbonates include: propylene carbonate, vinylene carbonate, ethylene carbonate and butylene carbonate.

Preferable examples of the alkyl alkoxyacetates include: 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferable examples of the alkyl pyruvates include: methyl pyruvate, ethyl pyruvate and propyl pyruvate.

Preferable examples of the benzene-ring-containing compounds include: benzene, toluene, ethylbenzene, ortho-xylene, meta-xylene and para-xylene. When the designation of xylene is used, xylene may be a mixture composed of ortho-xylene, meta-xylene, para-xylene, ethylbenzene and the like.

Examples of the preferably usable solvents include the solvents which have a boiling point of 110° C. or higher under the conditions of normal temperature (25° C.) and normal pressure ($10^5$ Pa). Specific examples of such solvents include: cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, propylene carbonate and xylene. In the present invention, the foregoing solvents may be used singly or in combination of two or more thereof.

The content of the solvent in the photosensitive negative resin composition is preferably 5.0 parts by mass or more and more preferably 10.0 parts by mass or more in relation to 100 parts by mass of the photosensitive negative resin composition. The content of the solvent is preferably 99.5 parts by mass or less and 99.0 parts by mass or less. Moreover, the content of the solvent is preferably 70.0 parts by mass or less and more preferably 60.0 parts by mass or less. With the content of the solvent set to be 5.0 parts by mass or more and 99.5 parts by mass or less, when the photosensitive negative resin composition is applied to a support (substrate), a resist layer having a satisfactory coated surface state is easily obtained.

Other Components

The photosensitive negative resin composition may contain, for example, the following other components in addition to the foregoing components. Specifically, such other components are not particularly limited; according to the intended applications, a surfactant, a sensitizer, a light absorber, a polymerization promoter, a flame retardant, a flame retardant aid and the like can be used.

According to the foregoing description, when photolithography is applied by using the photosensitive negative resin composition of the present embodiment, a fine structure excellent in circularity and sensitivity can be stably formed.

As a quencher of the acid, a nitrogen-atom-containing organic compound, in particular an amine compound, is sometimes used in a photoresist. However, when an amine compound is mixed with the epoxy-group-containing compound adopted in the present embodiment, the amine compound functions as a curing agent, and the curing is sometimes allowed to proceed in a dark reaction. Accordingly, it is difficult to store an amine compound over a long term while being mixed with the epoxy-group-containing compound adopted in the present embodiment. On the other hand, even when the component (c) and the component (d) of the present embodiment are mixed with an epoxy-group-containing compound, the occurrence of the dark reaction is extremely low in probability, and consequently, the component (c) and the component (d) of the present embodiment can be stored over a long term while being mixed with the epoxy-group-containing compound.

Production Method

The method for producing the fine structure of the present embodiment can be applied, for example, to the production of a liquid ejection head. In other words, for example, a liquid ejection head can be formed by using the photosensitive negative resin composition according to the present embodiment. The liquid ejection head is not particularly limited; as an example, an ink jet recording head may be quoted.

Figure 2:
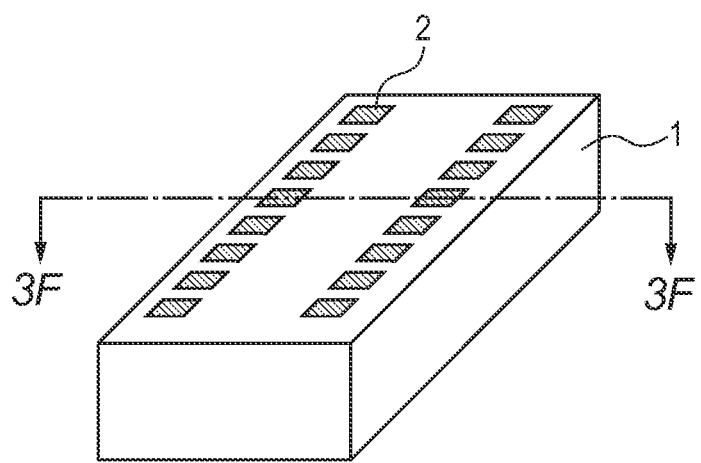
FIG. 2 is a schematic view of a substrate having an energy generating element.

FIG. 1 is a schematic oblique perspective view illustrating a constitutional example of an ink jet recording head. The ink jet recording head illustrated in FIG. 1 has, on a substrate having a plurality of energy generating elements 2, a flow-path-forming layer 4 constituting an ink ejection opening (ejection orifice) 5 and an ink flow path (liquid flow path) 3c communicating with the ink ejection orifice 5. On the substrate 1, an ink supply port (liquid supply port) 6 for supplying ink (liquid) to the ink flow path 3c is provided. As illustrated in FIG. 2, the plurality of the energy generating elements 2 are arranged on the substrate 1 at a predetermined pitch.

Hereinafter, the method for producing the ink jet recording head is described with reference to FIGS. 3A to 3F. FIGS. 3A to 3F correspond to the cross-sectional views in the 3F-3F cross sections in FIG. 1 and FIG. 2.

It is to be noted that a control signal input electrode (not shown) for operating the energy generating element 2 is connected to the energy generating element 2.

Figure 3A:
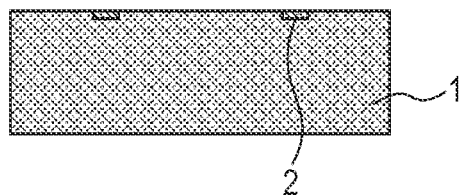
FIGS. 3A, 3B, 3C, 3D, 3E and 3F are a schematic process drawing illustrating an example of a method for forming a fine structure, using the photosensitive negative resin composition of the present embodiment.

First, as illustrated in FIG. 3A, the substrate 1 having the energy generating elements 2 is prepared.

The substrate 1 is preferably a Si substrate. In particular, the substrate 1 is preferably a silicon single crystal, and when the through-hole of the substrate 1 is bored by anisotropic etching, the substrate 1 is preferably a silicon single crystal having a crystal orientation of <100>. The through hole of the substrate 1 is bored by dry etching, sand blasting, or laser, the substrate 1 may also be a silicon single crystal having a crystal orientation of <110>.

The energy generating element 2 is not particularly limited as long as the energy generating element 2 is capable of giving ink ejection energy for electing an ink droplet and allowing an ink droplet to be ejected from the ink ejection orifice. For example, when a heating resistance element is used as the energy generating element 2, the heating resistance element heatsink in the vicinity of the heating resistance element to cause the state change in the ink and thus the ejection energy is generated.

Figure 3B:
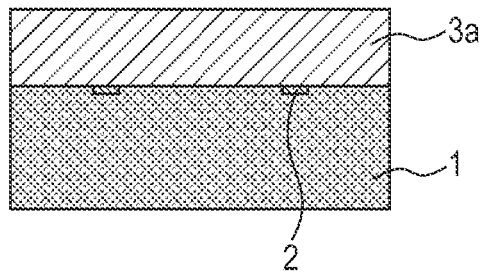

Next, as illustrated in FIG. 3B, a soluble resin composition is applied to the substrate 1 to form a soluble resin layer 3a for a flow path pattern as a mold material for the liquid flow path.

As a method for forming the soluble resin layer 3a, for example, a positive photosensitive resin is appropriately dissolved in a solvent and applied to the substrate 1 by a spin coating method or the like. By subsequently heating, the soluble resin layer 3a can be formed. The thickness of the soluble resin layer 3a is an intended height of the liquid flow path (ink flow path) and is preferably 2 to 50 μm without being particularly limited.

Figure 3C:
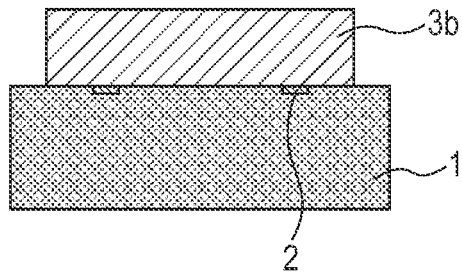

As illustrated in FIG. 3C, the soluble resin layer 3a is irradiated with a radiation and developed to form a flow path pattern 3b.

Next, the photosensitive negative resin composition of the present embodiment is disposed on the ink flow path pattern 3b and the substrate 1 to form the flow-path-forming layer 4.

The thickness of the flow-path-forming layer 4 is preferably 2 μm or more in terms of the thickness on the flow path pattern 3b. The upper limit of the thickness is not particularly limited, but is 100 μm or less in terms of the thickness on the flow path pattern 3b, in consideration of the developability of the ejection orifice section.

Figure 3D:
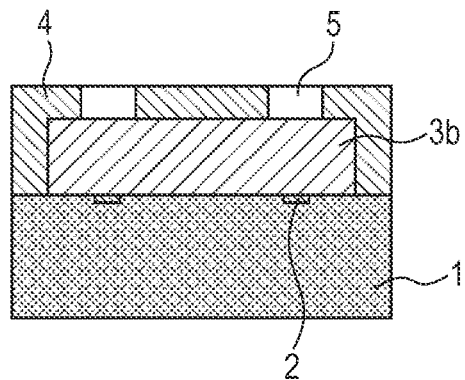

Next, the flow-path-forming layer 4 is irradiated with the i-line light, and then a development is performed with MIBK (methyl isobutyl ketone) or the like to carry out a patterning processing. Additionally, a rinsing treatment is performed with IPA or the like to form the ejection orifice 5 (FIG. 3D).

The center wavelength of the i-line is 365 nm.

Figure 3E:
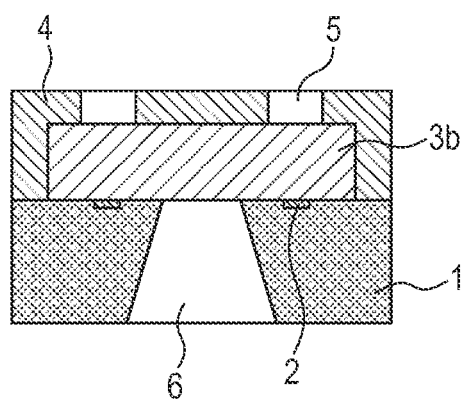

Next, as illustrated in FIG. 3E, the supply port 6 is formed by using an appropriate method such as an etching processing.

Figure 3F:
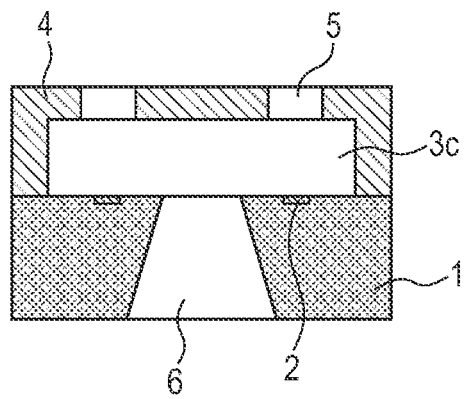

Next, as illustrated in FIG. 3F, the flow path pattern 3b is dissolved and removed with an appropriate solvent.

As the solvent, for example, an alkaline aqueous solution or an organic solvent can be used.

Subsequently, the substrate 1 is cut with a dicing saw, a dry etching or the like to be separated into chips, and then, an electrical bonding for driving the energy generating element 2 is performed. Additionally, a chip tank member for supplying ink is connected to complete the ink jet recording head.

It is to be noted that the foregoing method is not limited to the method for producing an ink jet head, but is also effective as a pattern formation method for forming a hollow pattern.

EXAMPLES

Hereinafter, Examples of the present invention are described, but the present invention is not limited to these Examples.

Examples 1 to 13 and 16

In each of Examples 1 to 13 and 16, according to the composition listed in Table 1, the component (a) and the component (b), and if necessary, the component (c), the component (d), a surfactant and a silane compound were mixed in 45 parts by mass of propylene glycol monomethyl ether as a solvent in relation to 100 parts by mass of the component (a), to prepare a photosensitive resin composition, and evaluations were performed by using the photosensitive resin composition. In Table 1, the numerical values in the compositions are given in the unit of parts by mass.

Each of these photosensitive resin compositions is applied to a support made of a silicon wafer with a spin coater, and then dried by pre-baking at 60° C. for 9 minutes to yield a 40 μm-thick photosensitive resin composition layer. After the pre-baking, according to the foregoing production method illustrated in FIGS. 3A to 3F, by using FPA-3000 i5+ (i-line stepper, manufactured by Canon Inc.), the photosensitive resin composition layer was subjected to a pattern exposure through a mask having an intended pattern drawn thereon, and then subjected to a post-exposure baking at 95° C. for 4 minutes with a hot plate.

It is to be noted that in the foregoing production method, the thickness of the flow-path-forming layer 4 made of the photosensitive negative resin composition was set at 20 μm in terms of the thickness above the ink flow path pattern 3b.

By appropriately varying the defocusing setting of the i-line stepper, for example, an intended taper angle of approximately 0.1 to 10 degrees can be obtained. In present Example, the exposure was performed so as for the taper angle to be 1 degree. Subsequently, by using CDS-860R+ (manufactured by Canon Inc.), the development was performed. Next, the resin pattern after the development was post-baked, together with the substrate, at 140° C. for 1 hour in an oven to yield a resist pattern of a cured material which was cured on the support.

Evaluations

Circularity

FIG. 4 illustrates a circular nozzle (cured product) formed by the foregoing resist pattern formation method wherein the exposure was performed by using a perfect circle pattern mask having a design diameter of 15 μm. In the obtained circular nozzle, the length measurement was performed for the line segments Y1 to Y4, and the distance of each of Y1 to Y4 was determined. Here, the unit μm was used. The line segment 3F-3F in FIG. 4 corresponds to the line segment 3F-3F in FIG. 1, indicating the same direction. Of the four distances obtained, the longest distance was defined as MAX(Y) and the shortest distance was defined as MIN(Y), and the circularity was derived according to the following formula (1). The smaller the value of the circularity, the better the value of the circularity.

Circularity=(MAX($Y$)−MIN($Y$))/MIN($Y$)×100    formula (1)

Sensitivity

In the formation of the circular nozzle illustrated in FIG. 4, i-line exposure was performed while the amount of exposure was being varied stepwisely in a range of 500 to 30000 J/m$^2$, the amount of exposure when the distance of Y1 came to be just 15 μm was taken as the optimal amount of exposure, and this amount of exposure was defined as the sensitivity.

Example 14

According to the composition described in Table 1, the component (a), the component (b), the component (c), a surfactant, a silane compound and a sensitizer were mixed in 45 parts by mass of propylene glycol monomethyl ether as a solvent in relation to 100 parts by mass of the component (a), to prepare a photosensitive resin composition, and evaluations were performed by using the photosensitive resin composition. As the sensitizer, 1-naphthol was used.

Example 15

According to the composition described in Table 1, the component (a), the component (b), the component (c), the component (e), a surfactant and a silane compound were mixed in 45 parts by mass of propylene glycol monomethyl ether as a solvent in relation to 100 parts by mass of the component (a), to prepare a photosensitive resin composition, and evaluations were performed by using the photosensitive resin composition. The component (e) is e1-21 having the cation moiety structure represented by the following compound, and the anion moiety structure of the component (e) is b2-23.

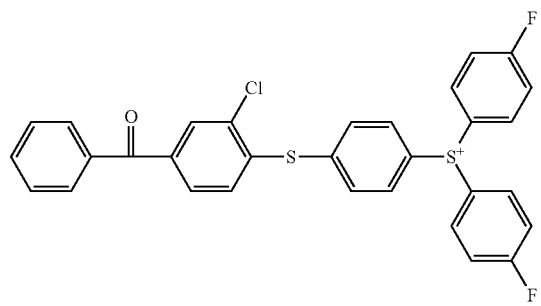

(e1-21)

Comparative Examples 1 to 3

In each of Comparative Examples 1 to 3, according to the composition described in Table 1, the component (a), a surfactant and a silane compound, and if necessary, the component (b), the component (c) and the component (e) were mixed in 45 parts by mass of propylene glycol monomethyl ether as a solvent in relation to 100 parts by mass of the component (a), to prepare a photosensitive resin composition, and evaluations were performed by using the photosensitive resin composition.

All of Examples 1 to 16 satisfy the relationship "Number of moles of the first onium salt>Number of moles of the second onium salt", or "Number of moles of the first onium salt>Number of moles of the third onium salt."

TABLE 1

|  |  |  | Examples |  |  |  |  |  |  |  |  |  |
|---|---|---|---|---|---|---|---|---|---|---|---|---|
|  | Component |  | 1 | 2 | 3 | 4 | 5 | 6 | 7 | 8 | 9 | 10 |
| Component (a) | a-1 |  | 100 | — | — | 100 | 100 | — | — | — | 100 | — |
|  | a-2 |  | — | 100 | 100 | — | — | — | — | — | — | 100 |
|  | a-3 |  | — | — | — | — | — | 100 | 100 | 100 | — | — |
| First onium salt (b) | Cation moiety (b1-17)/ Anion moiety (b2-23) |  | 2 | — | — | — | — | — | — | — | — | — |
|  | Cation moiety (b1-17)/ Anion moiety (b2-12) |  | — | — | — | — | — | 2 | 2 | 2 | — | — |

TABLE 1-continued

|  |  |  |  |  |  |  |  |  |  |  |  |
|---|---|---|---|---|---|---|---|---|---|---|---|
|  | Cation moiety (b1-25)/ Anion moiety (b2-22) | — | — | — | 2 | — | — | — | — | — | — |
|  | Cation moiety (b1-1)/ Anion moiety (b2-1) | — | — | 2 | — | — | — | — | — | — | — |
|  | Cation moiety (b1-17)/ Anion moiety (b2-14) | — | — | — | — | 2 | — | — | — | — | — |
|  | Cation moiety (b1-17)/ Anion moiety (b2-22) | — | — | — | — | — | — | — | — | 2 | 2 |
|  | Cation moiety (b1-30)/ Anion moiety (b2-10) | — | 2 | — | — | — | — | — | — | — | — |
| Second onium salt (c) | Cation moiety (c1-3)/ Anion moiety (c2-1) | — | — | — | — | — | — | — | — | — | — |
|  | Cation moiety (c1-2)/ Anion moiety (c2-2) | — | — | — | — | — | — | — | — | — | — |
|  | Cation moiety (c1-5)/ Anion moiety (c2-7) | — | — | — | — | — | — | — | — | — | — |
|  | Cation moiety (c1-31)/ Anion moiety (c2-8) | — | — | — | — | — | — | — | — | 0.5 | — |
|  | Cation moiety (c1-2)/ Anion moiety (c2-6) | — | — | — | — | — | — | — | — | — | — |
|  | Cation moiety (c1-1)/ Anion moiety (c2-26) | — | — | — | — | — | — | — | 0.5 | — | — |
|  | Cation moiety (c1-45)/ Anion moiety (c2-7) | — | — | — | — | — | — | — | — | — | 0.5 |
|  | Cation moiety (c1-46)/ Anion moiety (c2-9) | — | — | — | — | — | — | — | — | 0.5 | — |
|  | Cation moiety (c1-19)/ Anion moiety (c2-14) | — | — | — | — | — | 0.5 | — | — | — | — |
| Third onium salt (d) | Cation moiety (d1-5)/ Anion moiety (d2-3) | — | — | — | — | 0.5 | — | — | — | — | — |
|  | Cation moiety (d1-2)/ Anion moiety (d2-18) | — | — | — | 0.5 | — | — | — | — | — | — |
|  | Cation moiety (d1-17)/ Anion moiety (d2-1) | — | — | 0.5 | — | — | — | — | — | — | — |
|  | Cation moiety (d1-18)/ Anion moiety (d2-12) | — | 0.5 | — | — | — | — | — | — | — | — |
|  | Cation moiety (d1-17)/ Anion moiety (d2-41) | 0.5 | — | — | — | — | — | — | — | — | — |
| Fourth onium salt (e) | Cation moiety (e1-1)/ Anion moiety (b2-23) | — | — | — | — | — | — | — | — | — | — |
| Surfactant | PF-6520*[1] | 0.01 | 0.01 | — | 0.01 | 0.01 | 0.01 | 0.01 | 0.01 | — | 0.01 |
| Silane compound | γ-Glycidoxypropyl-trimethoxysilane*[2] | 5 | 5 | 5 | 5 | 5 | 5 | 5 | 5 | 5 | 5 |
| Sensitizer | 1-Naphthol | — | — | — | — | — | — | — | — | — | — |
| Ejection orifice arrangement density |  | 600 dpi for one side × 2 rows = 1200 dpi | | | | | | | | | |
| Sensitivity |  | 5500 | 5500 | 5000 | 4500 | 4000 | 3500 | 3500 | 3500 | 4000 | 3500 |
| Circularity |  | 0.33 | 0.30 | 0.28 | 0.28 | 0.28 | 0.27 | 0.27 | 0.18 | 0.20 | 0.23 |

|  |  | Examples |  |  |  |  |  | Comparative Examples |  |  |
|---|---|---|---|---|---|---|---|---|---|---|
|  | Component | 11 | 12 | 13 | 14 | 15 | 16 | 1 | 2 | 3 |
| Component (a) | a-1 | — | 100 | — | — | — | — | — | 100 | — |
|  | a-2 | — | — | 100 | — | — | — | — | — | — |
|  | a-3 | 100 | — | — | 100 | 100 | 100 | 100 | — | 100 |
| First onium salt (b) | Cation moiety (b1-17)/ Anion moiety (b2-23) | — | — | — | — | — | 3 | — | — | — |
|  | Cation moiety (b1-17)/ Anion moiety (b2-12) | — | — | — | 0.4 | 1.5 | — | 2 | — | — |
|  | Cation moiety (b1-25)/ Anion moiety (b2-22) | — | — | — | — | — | — | — | — | — |
|  | Cation moiety (b1-1)/ Anion moiety (b2-1) | — | — | — | — | — | — | — | 2 | — |
|  | Cation moiety (b1-17)/ Anion moiety (b2-14) | 2 | — | — | — | — | — | — | — | — |
|  | Cation moiety (b1-17)/ Anion moiety (b2-22) | — | — | — | — | — | — | — | — | — |
|  | Cation moiety (b1-30)/ Anion moiety (b2-10) | — | — | — | — | — | — | — | — | — |
| Second onium salt (c) | Cation moiety (c1-3)/ Anion moiety (c2-1) | — | — | — | 0.5 | 0.2 | 0.3 | — | — | 0.5 |
|  | Cation moiety (c1-2)/ Anion moiety (c2-2) | — | — | 0.5 | — | — | — | — | — | — |
|  | Cation moiety (c1-5)/ Anion moiety (c2-7) | — | 0.5 | — | — | — | — | — | — | — |
|  | Cation moiety (c1-31)/ Anion moiety (c2-8) | — | — | — | — | — | — | — | — | — |
|  | Cation moiety (c1-2)/ Anion moiety (c2-6) | 0.5 | — | — | — | — | — | — | — | — |

TABLE 1-continued

|  |  |  |  |  |  |  |  |  |  |  |
|---|---|---|---|---|---|---|---|---|---|---|
|  | Cation moiety (c1-1)/<br>Anion moiety (c2-26) | — | — | — | — | — | — | — | — | — |
|  | Cation moiety (c1-45)/<br>Anion moiety (c2-7) | — | — | — | — | — | — | — | — | — |
|  | Cation moiety (c1-46)/<br>Anion moiety (c2-9) | — | — | — | — | — | — | — | — | — |
|  | Cation moiety (c1-19)/<br>Anion moiety (c2-14) | — | — | — | — | — | — | — | — | — |
| Third onium salt (d) | Cation moiety (d1-5)/<br>Anion moiety (d2-3) | — | — | — | — | — | — | — | — | — |
|  | Cation moiety (d1-2)/<br>Anion moiety (d2-18) | — | — | — | — | — | — | — | — | — |
|  | Cation moiety (d1-17)/<br>Anion moiety (d2-1) | — | — | — | — | — | — | — | — | — |
|  | Cation moiety (d1-18)/<br>Anion moiety (d2-12) | — | — | — | — | — | — | — | — | — |
|  | Cation moiety (d1-17)/<br>Anion moiety (d2-41) | — | — | — | — | — | — | — | — | — |
| Fourth onium salt (e) | Cation moiety (e1-1)/<br>Anion moiety (b2-23) | — | — | — | — | 4 | — | — | — | 4 |
| Surfactant | PF-6520*[1] | 0.01 | 0.01 | 0.01 | 0.01 | 0.01 | 0.01 | 0.01 | 0.01 | 0.01 |
| Silane compound | γ-Glycidoxypropyl-trimethoxysilane*[2] | 5 | 5 | 5 | 5 | 5 | 5 | 5 | 5 | 5 |
| Sensitizer | 1-Naphthol | — | — | — | 1 | — | — | — | — | — |
| Ejection orifice arrangement density |  | 600 dpi for one side × 2 rows = 1200 dpi | | | | | | | | |
| Sensitivity |  | 4000 | 3500 | 3500 | 3500 | 4000 | 4000 | 2000 | 2500 | 30000 |
| Circularity |  | 0.17 | 0.22 | 022 | 0.27 | 0.20 | 0.22 | 1.30 | 1.33 | 0.42 |

(a-1): EPICLON N-865 (trade name, manufactured by Dainippon Ink and Chemicals Inc.)
(a-2): JER157S70 (trade name, manufactured by Japan Epoxy Resins Co., Ltd.)
(a-3): EHPE 3150 (trade name, manufactured by Dicel Chemical Industries, Ltd.)
*[1]PF-6520 (trade name, manufactured by OMNPVA Solutions Inc.)
*[2]SILQUEST A-187 SILANE (trade name, manufactured by Momentive Performance Materials Japan LLC)

In each of Examples 1 to 16, the circularity was determined by using the photosensitive negative resin composition including the component (b) and the component (c) or the component (d), and the circularity was found to be 0.4 or less to yield a high mask reproducibility.

On the other hand, in each of the negative resin compositions of Comparative Examples 1 and 2, including the component (b) but not including the component (c) or the component (d), the circularity was 1 or more, and hence the mask reproducibility was not sufficient.

In the negative resin composition of Comparative Example 3, including the component (c) but not including the component (b), the circularity was comparatively as satisfactory as 0.42, but on the other hand, the sensitivity was as extremely low as 30000 J/m$^2$, failing to achieve both good circularity and sensitivity.

According to the foregoing description, the photosensitive negative resin composition of the present invention is found to have an excellent response precision and an excellent sensitivity. Accordingly, by using the photosensitive negative resin composition of the present invention and by applying photolithography, a fine structure having a high response precision and a high sensitivity, and being excellent in circularity can be stably formed. Consequently, the photosensitive negative resin composition of the present invention can be suitably used for various devices subjected to fine processing such as MEMS.

Thus, the present invention can provide a photosensitive negative resin composition excellent in response precision and sensitivity, when photolithography is applied to the photosensitive negative resin composition.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-081950, filed Apr. 10, 2013, which is hereby incorporated by reference herein in its entirety.

What is claimed is:

1. A photosensitive negative resin composition comprising:
(a) an epoxy-group-containing compound;
(b) a first onium salt including a cation moiety structure represented by formula (b1) and an anion moiety structure represented by formula (b2); and
(d) a third onium salt including a cation moiety structure represented by formula (d1) and an anion moiety structure represented by formula (d2):

(b1)

(b2)

wherein $R_1$ to $R_3$ each independently represent an organic group having 1 to 30 carbon atoms which may have a substituent; in the whole constituent atoms of $R_1$ to $R_3$, at least two or more oxygen atoms are included; at least one of $R_1$ to $R_3$ includes a cyclic carbonyl structure; X is selected from the group consisting of a carbon atom, a nitrogen atom, a phosphorus atom, a boron atom and an antimony atom; Y is selected from the group consisting of $-S(=O)_2-$, an alkylene fluoride group, $-O-CF_2-$, $-C(=O)-CF_2-$, $-O-C(=O)-CF_2-$, $-C(=O)-O-CF_2-$, and a single bond; $R_4$ represents a hydrocarbon group having 1 to 30 carbon atoms which may be substituted with a fluorine atom; in the case where X represents a carbon atom, m and n represent integers that satisfy m+n=3 and n=0, 1, 2; in the case where X represents a nitrogen atom, m and n represent integers that satisfy m+n=2 and n=0, 1; in the case where X represents a phosphorus atom or an antimony atom, m and n represent integers that satisfy m+n=6 and n=0 to 6; and in the case where X represents a boron atom, m and n represent integers that satisfy m+n=4 and n=0 to 3;

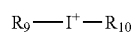  (d1)

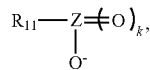  (d2)

wherein $R_9$ and $R_{10}$ each independently represent an aryl group having 6 to 15 carbon atoms which may have a substituent; Z is selected from the group consisting of a carbon atom and a sulfur atom; in the case where Z is a carbon atom, k=1; in the case where Z is a sulfur atom, k=2; and $R_{11}$ represents an optionally substituted organic group having 1 to 20 carbon atoms, which comprises an aromatic hydrocarbon.

2. The photosensitive negative resin composition according to claim 1, wherein:

Number of moles of the first onium salt×0.7>Number of moles of the third onium salt>Number of moles of the first onium salt×0.02.

3. The photosensitive negative resin composition according to claim 1, wherein the component (b) has a photosensitivity at least to the i-line.

4. The photosensitive negative resin composition according to claim 1, wherein $R_{11}$ includes an aromatic hydrocarbon or an alicyclic hydrocarbon.

5. The photosensitive negative resin composition according to claim 1, wherein X is a phosphorus atom.

6. A method for forming a fine structure, comprising:
(1) disposing on a substrate the photosensitive negative resin composition according to claim 1, and
(2) subjecting the photosensitive negative resin composition to a patterning processing by photolithography using an i-line.

* * * * *